(12) United States Patent
Shin et al.

(10) Patent No.: US 7,873,885 B1
(45) Date of Patent: Jan. 18, 2011

(54) SSD TEST SYSTEMS AND METHODS

(75) Inventors: MyeongJin Shin, San Ramon, CA (US); Charles C. Lee, Cupertino, CA (US); I-Kang Yu, Palo Alto, CA (US); Abraham Chih-Kang Ma, Fremont, CA (US)

(73) Assignee: Super Talent Electronics, Inc., San Jose, CA (US)

(*) Notice: Subject to any disclaimer, the term of this patent is extended or adjusted under 35 U.S.C. 154(b) by 187 days.

(21) Appl. No.: 12/356,072

(22) Filed: Jan. 19, 2009

Related U.S. Application Data

(63) Continuation-in-part of application No. 12/042,316, filed on Mar. 4, 2008, now Pat. No. 7,802,155, and a continuation-in-part of application No. 11/626,347, filed on Jan. 23, 2007, now Pat. No. 7,702,984, and a continuation-in-part of application No. 11/979,102, filed on Oct. 31, 2007, now abandoned, and a continuation-in-part of application No. 12/025,706, filed on Feb. 4, 2008, and a continuation-in-part of application No. 11/466,759, filed on Aug. 23, 2006, now Pat. No. 7,702,831, which is a continuation-in-part of application No. 10/761,853, filed on Jan. 20, 2004, now abandoned.

(51) Int. Cl.
*G01R 31/28* (2006.01)
*G11C 16/04* (2006.01)

(52) U.S. Cl. .................. 714/724; 365/185.33

(58) Field of Classification Search .............. 714/724, 714/703, 718, 742, 799, 746, 738, 739, 728; 365/185.33; 702/108, 118, 185
See application file for complete search history.

(56) References Cited

U.S. PATENT DOCUMENTS

| 5,581,510 | A  | * | 12/1996 | Furusho et al. ........... 365/201 |
| 7,197,662 | B2 | * | 3/2007  | Bullen et al. ............... 714/6 |
| 7,788,553 | B2 | * | 8/2010  | Chow et al. ............... 714/718 |

* cited by examiner

Primary Examiner—Phung M Chung
(74) Attorney, Agent, or Firm—Roger H. Chu

(57) ABSTRACT

Solid state drive (SSD) testing processes and methods are disclosed. In one embodiment, the SSD testing process comprises: specifying a set of test parameters of firmware, operating system and flash memory for a plurality of SSDs under test (DUTs) in an SSD test system, the set of test parameters includes a model number, a serial number, a desired defective or bad block ratio and a size of the firmware, wherein the model and serial number are configured onto each of the DUTs; performing an initialization test of all of the DUTs based on the specified test parameters to determine a pre-qualified group of the DUTs that passed the initialization test; conducting at least one level of burn-in test for each SSD in the pre-qualified group; conducting at least one level of burn-in test for each SSD in the pre-qualified group; and assigning a quality grade to said each SSD based on which level of the at least one level of burn-in test said each SSD has been tested and passed, wherein the quality grade includes a commercial grade SSD made using at least one Multi-Level Cell flash memory.

19 Claims, 26 Drawing Sheets

1200

Phase X

○ Adjust Environment

Voltage [ ] VOLT

Temperature [ ] °C

○ Power On/Off Test

Repeat Count [ ] TIMES

○ ATA Command Test

○ Test Data Pattern

☐ Sequential Data Pattern

☐ Random Data Pattern

☐ Zero Data Pattern

☐ One Data Pattern

☐ Find a Flash Error

Phase Repeat Count [ ] TIMES

SSD TEST SYSTEMS AND METHODS

CROSS-REFERENCE TO RELATED APPLICATIONS

This application is a continuation-in-part (CIP) of U.S. Patent Application for "Non-Volatile Memory Device Manufacturing Process Testing Systems and Methods Thereof", Ser. No. 12/042,316, filed on Mar. 4, 2008, now U.S. Pat. No. 7,802,155.

This application is also a CIP of U.S. Patent Application for "High Volume Testing for USB Electric Data Flash Cards", Ser. No. 11/626,347, filed on Jan. 23, 2007, now U.S. Pat. No. 7,702,984.

This application is also a CIP of U.S. Patent Application for "System and Method for Producing High Volume Flash Memory Cards", Ser. No. 11/979,102, filed on Oct. 31, 2007, now abandoned.

This application is also a CIP of co-pending U.S. Patent Application for "Methods and Systems for Managing Memory Addresses in A Large Capacity Multi-level Cell (MLC) Based Flash Memory Device", Ser. No. 12/025,706, filed on Feb. 4, 2008.

This application is also a CIP of U.S. Patent Application for "Flash memory Controller for Electronic Data Flash Card", Ser. No. 11/466,759, filed on Aug. 23, 2006, now U.S. Pat. No. 7,702,831, which is a CIP of U.S. Patent Application for "Highly Integrated Mass Storage Device with An Intelligent Flash Controller", Ser. No. 10/761,853, filed on Jan. 20, 2004, now abandoned.

FIELD OF THE INVENTION

The invention relates to solid state drive (SSD) storage system, more particularly to systems and methods for conducting SSD reliability test.

BACKGROUND OF THE INVENTION

Traditionally, hard disk drives have been used as data storage in a computing device. With advance of non-volatile memory (e.g., NAND flash memory), some attempts have been made to use non-volatile memory as the data storage. One form of the data storage device using NAND flash memory is referred to as solid state drive (SSD).

Advantages of using NAND flash memory as data storage over hard disk drive are as follows:

(1) No moving parts;
(2) No noise or vibration caused by the moving parts;
(3) Higher shock resistance;
(4) Faster startup (i.e., no need to wait for spin-up to steady state);
(5) Faster random access;
(6) Faster boot and application launch time; and
(7) Lower read and write latency (i.e., seek time).

In order to ensure SSD's reliability, a rigorous testing procedure during manufacturing is required. Because SSD is based on NAND flash memory, idiosyncrasies of the controller and natures of the flash memory must be accounted for in the testing procedure. For example, NAND flash memory based SSD is generally arranged in blocks, pages and sectors. A specific logical-to-physical address mapping scheme is employed to allow efficient usage of the NAND flash. In addition, a wear leveling scheme is employed in the SSD controller to ensure entire flash memory array is used as evenly as possible. Since wear leveling and logical-to-physical mapping schemes dictate flash memory data programming or writing order, the test platform cannot control data programming to which sector/page/block of the SSD. As a result, test platform cannot locate where the problem flash memory when the SSD controller controls the SSD. Therefore, it would be desirable to have an improved SSD testing system and method that can overcome the problem described above.

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

Methods and systems for conducting solid state drive (SSD) test are disclosed. According to one aspect of the present invention, SSD test system includes a main test server, a voltage control board, a temperature control board, and a plurality of test slots each configured to contain a slot test device. Each slot test device is further configured to facilitate a plurality of SSDs under test. The main test server and the plurality of the test slots are coupled together via a network hub on a data network (e.g., Ethernet). Voltage control board and temperature control board are connected to the main test server through a dedicated data link (e.g., RS232C). The main test server can be a server computer configured with at least a display monitor, a central processing unit, a random access memory, and a storage device, network interface. The slot test device can be a printed circuit board containing special integrated circuits mounted or configured thereon.

The SSD test system is configured to test SSDs under various conditions each in a different combination of electric voltage and temperature. SSD test includes an overall test, which further includes power on/off test, command test, and burn-in test. Each of the tests including overall test can be conducted repeatedly. Voltage and temperature are controlled by the voltage control and temperature control board, respectively. The power on/off test is configured to ensure SSDs can survive one or more times of random power shut off. The command test is configured to ensure SSDs perform appropriately in response to certain set of computer commands (e.g., ATA (Advanced Technology Attachment) commands). The burn-in test is configured to ensure SSDs can endure a long running data programming (i.e., writing) operations.

According to another aspect, testing the random power shut off is achieved with the main test server controlling a verifiable and reproducible random delay to embark a power cycle operation (i.e., turn electric power off and then on) while the SSD is under continuous data programming operations. In order to pass the power on/off test, the SSD under test must be able to recover all of the data written before the power cycle occurred. This can be achieved by checking whether critical area of the SSD (e.g., File Allocation Table (FAT)) is intact after a fixed time delay after the power cycle. The fixed time delay allows the SSD to initialize or start up (e.g., boot up).

According to yet another aspect of the present invention, the data being written to the SSD under test can have various data patterns: sequential, random, all zeros, all ones, alternating zeros and ones, etc. A copy of 'golden file' containing various data patterns is kept in the slot test device. A mechanism (e.g., a file pointer) is configured to indicate a starting location of the 'golden file' to be written to the SSD under test. Once a file has been completely written or programmed in the SSD, the written file is read back and to be compared with the 'golden copy' to ensure no data corruption has occurred. Order of which file in the 'golden file' to be written can be sequential or random as long as the order can be tracked and reproducible by the slot test device. Similar, the random delay to power cycle must be reproducible so that the SSD under test can be verified.

According to still another aspect, SSD contains a normal mode and a test mode such that the test mode is activated when a test indicator flag is received and detected. The test indicator flag can be initiated from a slot test device, in which the SSD under test is inserted thereon. The test mode allows the test platform (e.g., SSD test system, slot test device, SSD self test) to direct data program to the NAND flash memory array bypassing the SSD controller.

According to one embodiment, the present invention is a system for conducting solid state drives burn-in test. The system includes at least the followings: a main test server configured for a group of SSDs under test; a plurality of slot test devices coupled to the main test server via a data network, each of the slot test devices is configured to facilitate a portion of the group of SSDs under test and said each the slot test devices is capable of: setting each of the SSDs to a test mode, generating various patterns of test data and verifying whether the generated test data have been written successfully to said each of the SSDs, wherein the test mode allows direct data programming to said each of the SSDs; and an input device and an output device configured for receiving and displaying data or information during the overall SSD test; whereby a SSD test application module is installed on the main test server such that the test application module is centrally controlled and test results can be collected.

According to another embodiment, the present invention is a solid state drive (SSD) testing process. The SSD testing process comprises at least the following: specifying a set of test parameters of firmware, operating system and flash memory for a plurality of SSDs under test (DUTs) in an SSD test system, the set of test parameters includes a model number, a serial number, a desired defective or bad block ratio and a size of the firmware, wherein the model and serial number are configured onto each of the DUTs; performing an initialization test of all of the DUTs based on the specified test parameters to determine a pre-qualified group of the DUTs that passed the initialization test; and assigning a quality grade to said each SSD based on which level of the at least one level of burn-in test said each SSD has been tested and passed.

The SSD testing process further comprises scanning entire flash memory of each of the DUTs to determine a bad block ratio, DUTs with the bad block ratio lower than the desired defective block ratio are included in the pre-qualified group; preparing an initial storage area to ensure the initial storage area is suitable for storing the firmware, DUTs having the suitable initial storage area are included in the pre-qualified group; downloading the firmware from the main test server to the initial storage area of said each of the DUTs, whereby the firmware can be executed by a controller of said each of the DUTs but not be accessed and/or altered in any way by users; and formatting the flash memory based on an operating system standard defined in the specified test parameter, such that the flash memory can be accessed by a user.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIG. 12 is a diagram showing an exemplary user interface of an SSD test application module in accordance with one embodiment of the present invention.

DETAILED DESCRIPTION

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1A-12. However, those skilled in the art will readily appreciate that the detailed description given herein with respect to these figures is for explanatory purposes as the invention extends beyond these limited embodiments.

Figure 1A:
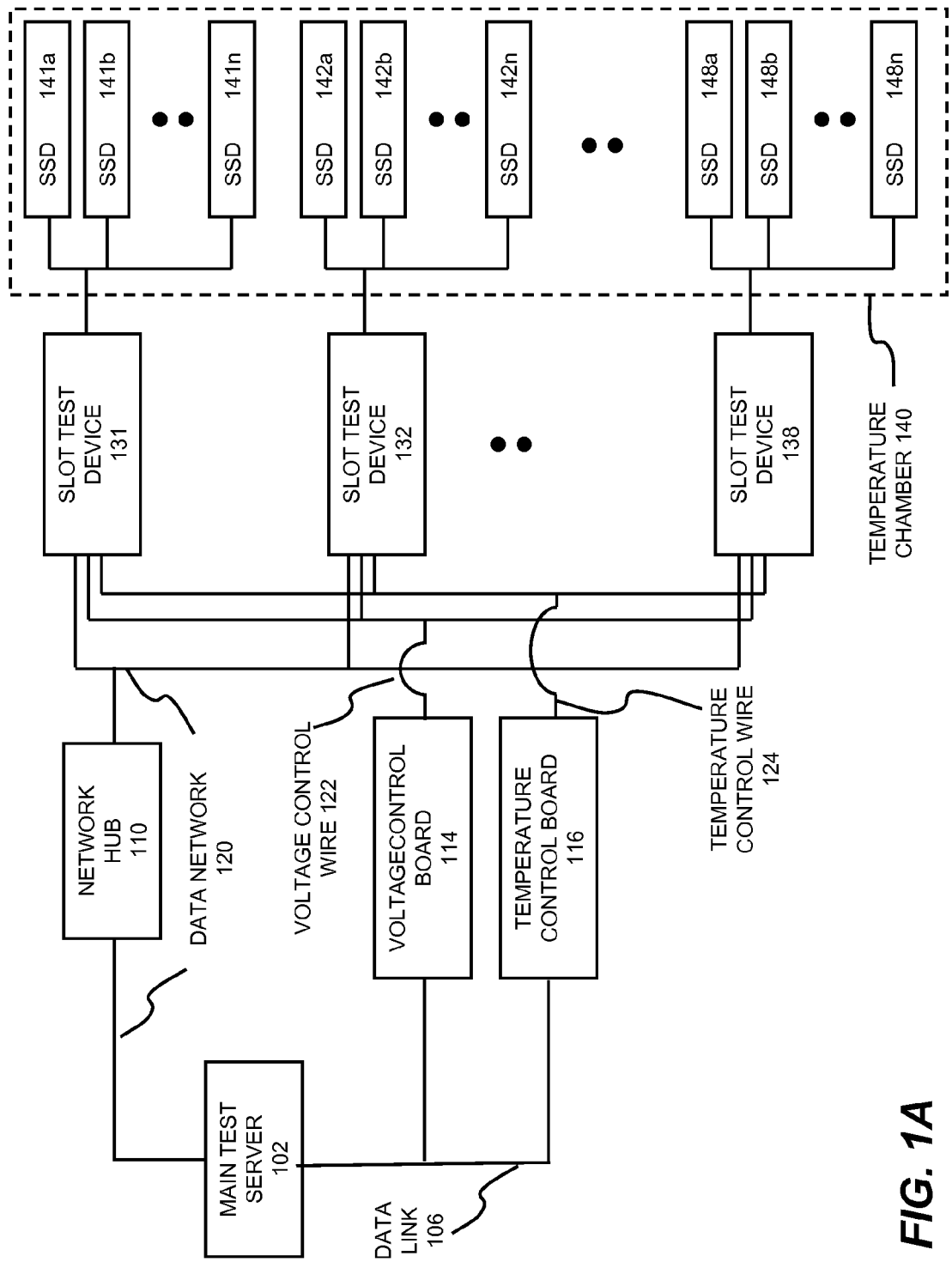
FIG. 1A is a block diagram showing an exemplary SSD test system, according to an embodiment of the present invention.

FIG. 1A is a block diagram illustrating an exemplary SSD test system 100 in accordance with one embodiment of the present invention. The SSD test system 100 includes a main test server 102, a network hub 110 and a number of slot test devices 131-138 coupled to the network hub 110 via a data network 120 (e.g., Ethernet). Each of the slot test devices is configured for facilitate a plurality of SSDs 141a-n, 142a-n . . . , 148a-n under test. In addition, a voltage control board 114 and a temperature control board 116 are coupled to the main test server 102 via a data link 106 (e.g., RS232C). Voltage control board 114 is configured to control the operating voltage of the SSDs under test via voltage control wire 122 through the slot test devices 131-138. Temperature control board 116 is configured to control the operating temperature of a temperature chamber that houses the SSDs under test.

The main test server 102 controls overall SSD test for a group of SSDs 141a-n, 142a-n, . . . , 148a-n. Each of the slot test devices 131-138 is configured to perform a series of functions as follows: setting each SSDs to a test mode, generating various test data patterns, verifying whether the test data has been written to each SSD successfully. In a power on/off test, the power to the SSDs under test is turned off in a verifiable and reproducible random time interval while the test data being programmed or written to the SSDs. Once the power is turned back on, the slot test device checks whether data integrity has been preserved in the SSDs.

Testing SSD in a networked environment include a number of advantages including, but not limited to, test software can be controlled centrally, test results or statistics can be collected for all DUTs for analysis, optimization of test plan can be achieved easier.

Figure 1B:
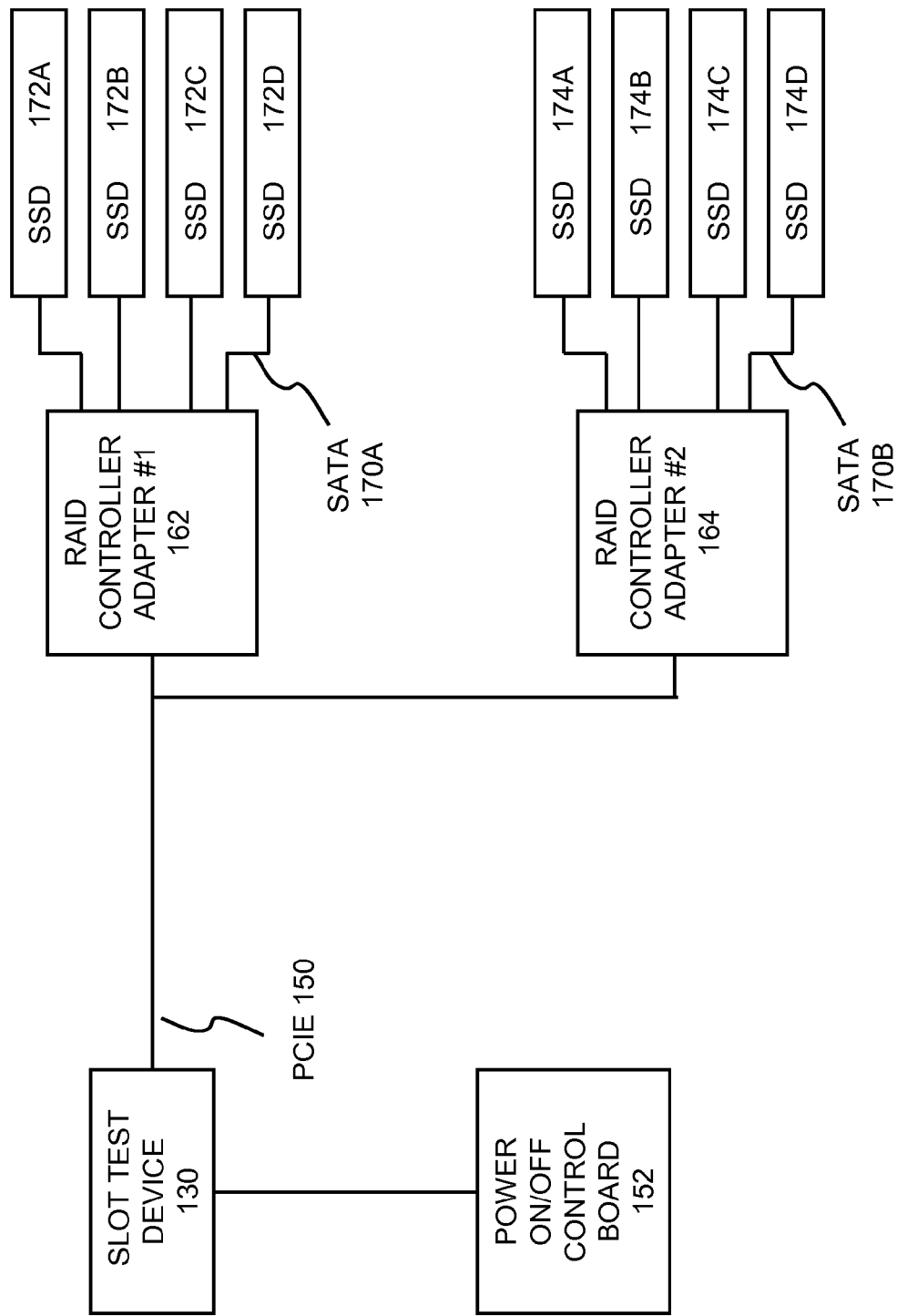
FIG. 1B is a block diagram showing salient components of a slot test device of the exemplary SSD testing system of FIG. 1A.

FIG. 1B shows an exemplary slot test device 130 in accordance with one embodiment of the present invention. The slot test device 130 is coupled to a power on/off control board 152 and a pair of RAID (Redundant Array of Inexpensive Disks) controller adapters 162-164 via a PCI-E (Peripheral Component Interconnect Express) link 150. Each of the RAID controller adapters 162-164 is configured for accommodating four SSD 172A-D and 174A-D. Each SSD is coupled to the adaptor via a SATA (Serial Advance Technology Attachment) link 170A-B.

Figure 2:
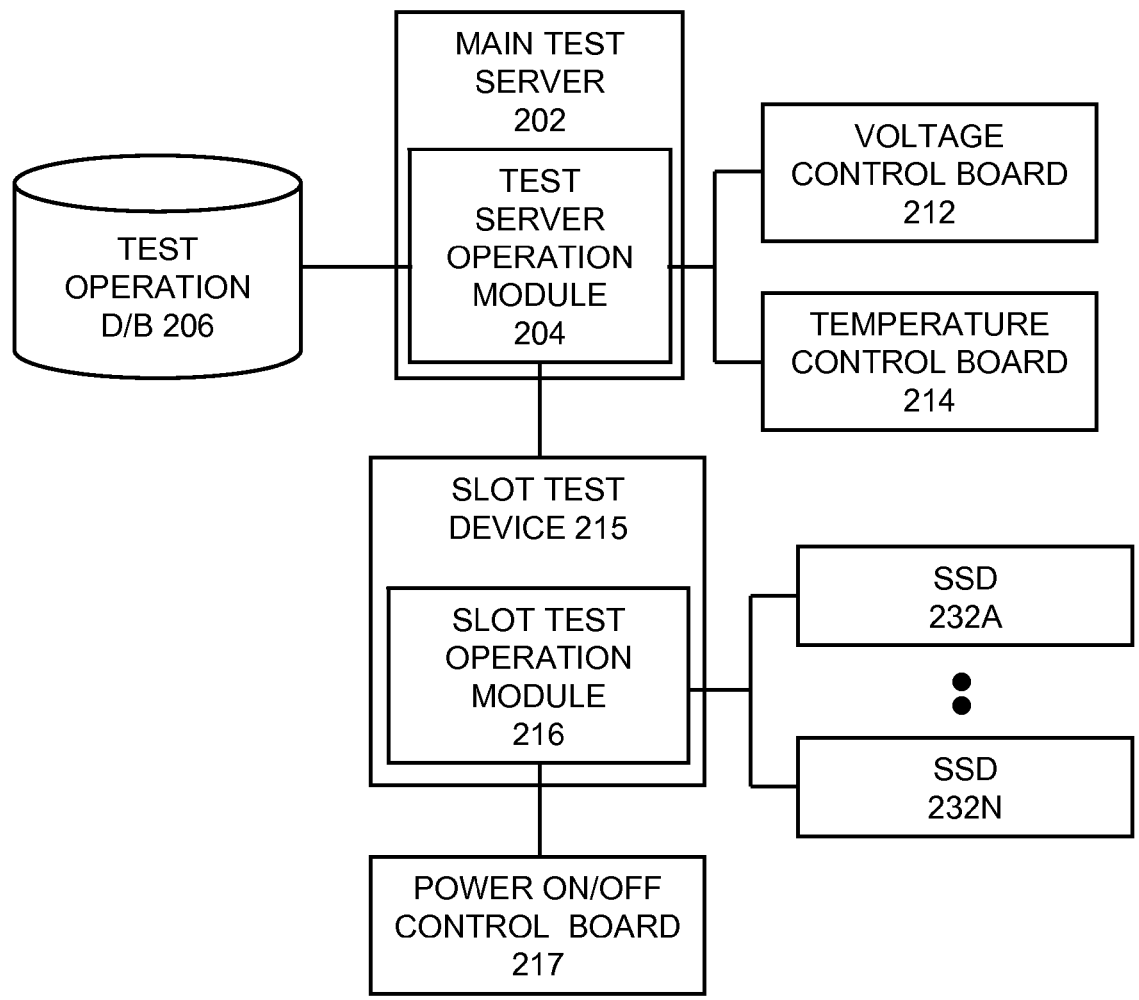
FIG. 2 is a function block diagram depicting an exemplary main test server and a slot test device operable to facilitate the testing of SSD in accordance with one embodiment of the present invention.

Referring now to FIG. 2, in which a function block diagram is shown for depicting an exemplary main test server and a slot test device operable to facilitate the testing of SSD in accordance with one embodiment of the present invention.

Main test server 202 with a test server operation module 204 installed thereon is configured to use data stored on a test operation database 206 to communicate with a voltage control board 212 and a temperature control board 214. Also communicating with the main test server 202 is a plurality of slot test devices 215 (only one shown). The slot test device 215 with a slot test operation module 216 installed thereon can communicate with the main server 202 and a number of SSDs 232A-N under test. Also coupling to the slot test device 215 is a power on/off control board 217.

Figure 3A:
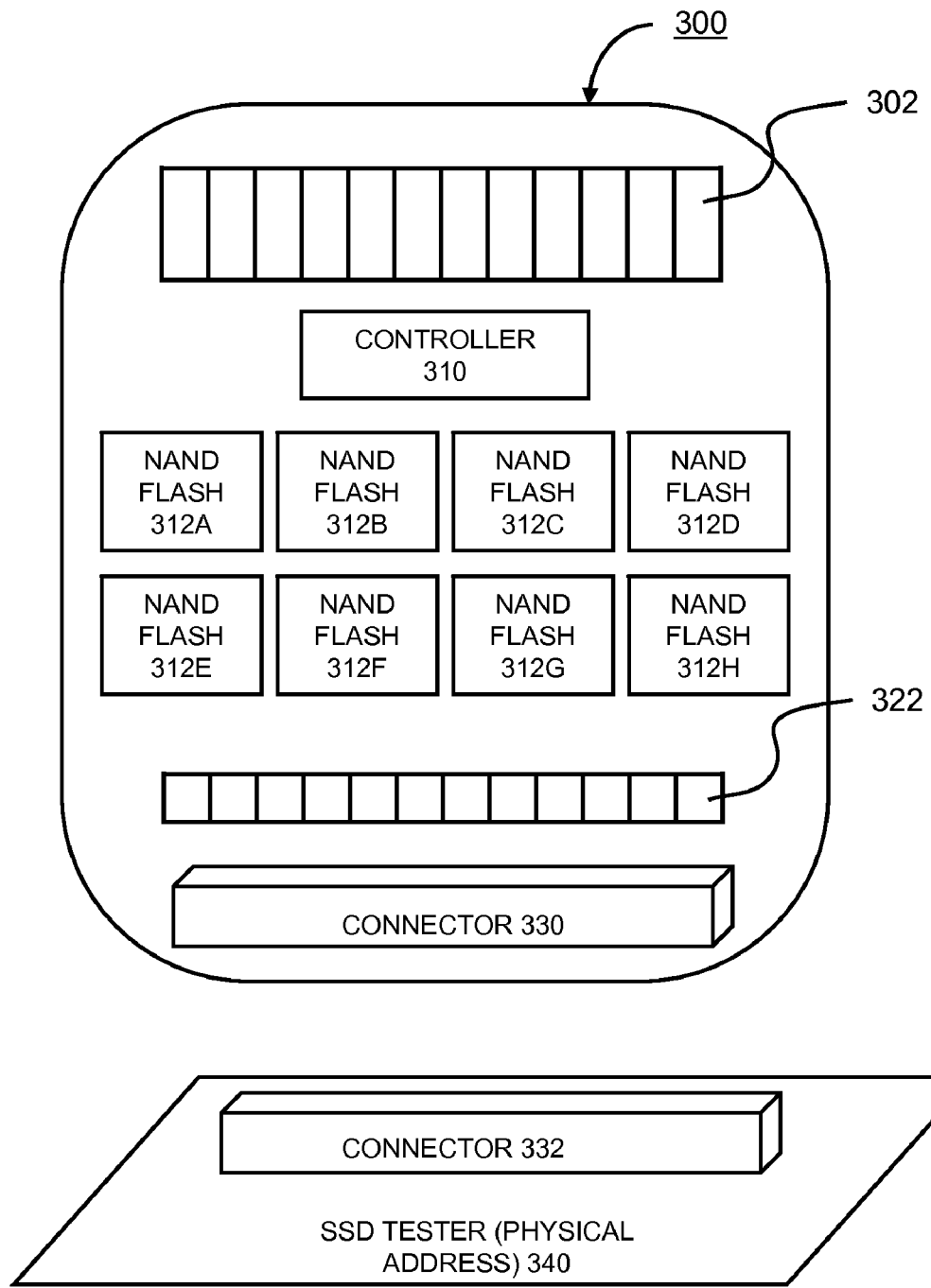
FIGS. 3A and 3B are block diagrams collectively illustrating an alternative exemplary SSD tester, according to another embodiment of the present invention.
Figure 3B:
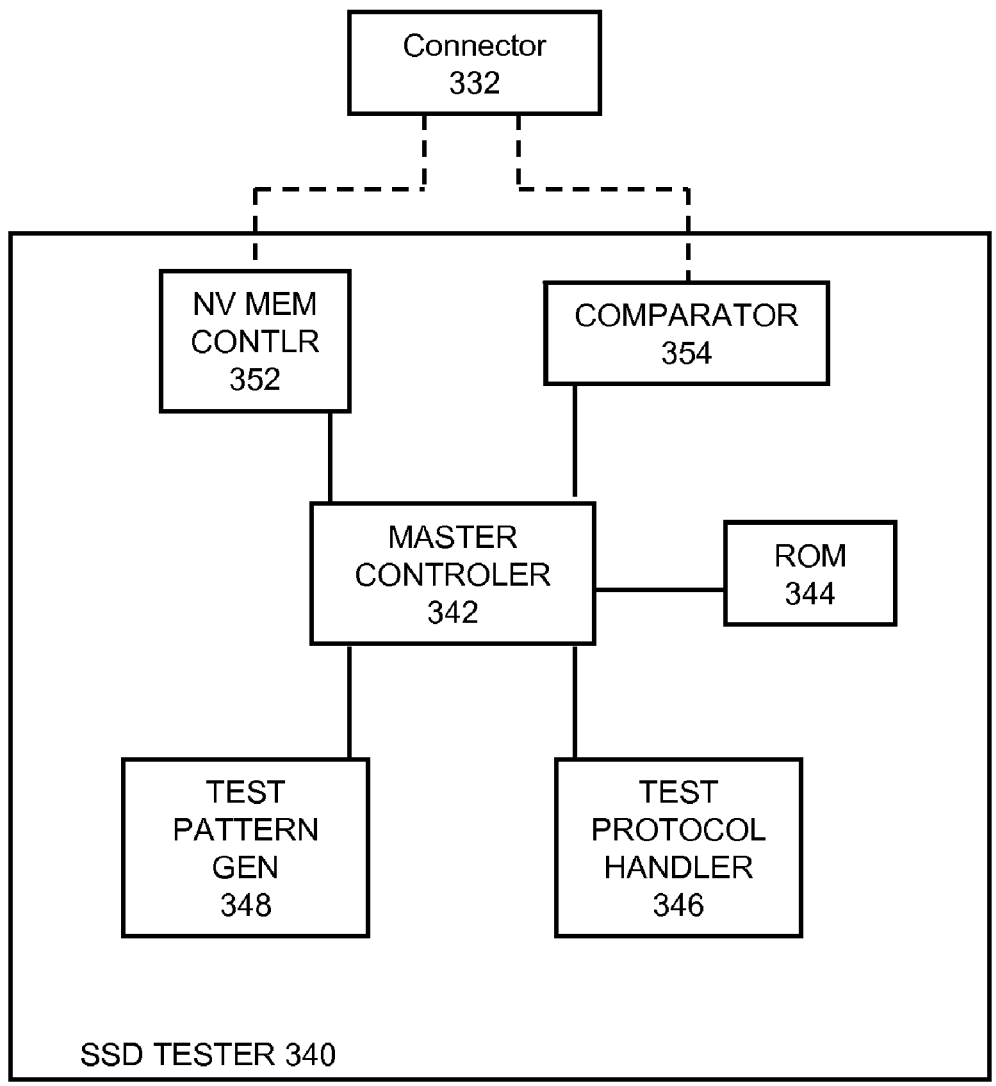

An alternative SSD test setup is shown in FIGS. 3A-3B collectively. The setup includes an SSD 300 and a special purpose (physical address access) SSD tester 340. The SSD 300 comprises a SSD controller 310, a plurality of contact pads 302, at least one NAND flash memory chip 312A-H, and a plurality of physical address access tabs 322 and corresponding connectors 330. SSD controller 310 is configured for controlling the SSD 300. The contact pads 302 are configured as interfaces to a host device (e.g., a computer) for logical address access. NAND flash memories 312A-H form a non-volatile memory array for storing data. The physical address access tabs 322 are configured for accessing the volatile memory array through physical address directly. The tabs 322 are generally used in a test mode of the SSD 300. The connector 330 is configured for providing a connecting interface to the special purpose SSD tester 340, which can be a customer design printed circuit board for direct control of the volatile memory array 312A-H of the SSD 340 via physical address.

A block diagram of an exemplary SSD tester 340 is shown in FIG. 3B. The SSD tester comprises a tester connector 332, master controller 342, read-only memory (ROM) 344, test data pattern generator 348, test protocol handler 346, non-volatile memory controller 352 and comparator 354. The tester connector 332 is configured as a counter part of the connector 330 of the SSD 300. For example, if the SSD connector 330 is a male connector, then the tester connector 332 is female, or vice versa. The master controller 342 is configured to control overall functions of the SSD tester 340. ROM 344 is coupled to the master controller 342 to provide storage space for storing data and modules for testing SSD 300. The test protocol handler 346 is configured for handling various test protocols to the SSD 300. The test data pattern generator 348 is configured for generating various test data patterns including, but not limited to, sequential, all zeros, all ones, alternating zeros and ones. The non-volatile memory controller 352 is configured for controlling non-volatile memory array of the SSD under test via physical address (e.g., read, write and erase). The comparator 354 is configured for verifying whether the test data has been successfully programmed to the SSD 300. For example, the test data is first written or programmed to the SSD 300. The SSD tester 340 reads the just written test data from the SSD 300 and compares it with a "golden copy" using the comparator 354. The "golden copy" can be a known data pattern or a physical file with specific pattern stored on the SSD tester 340.

Figure 4:
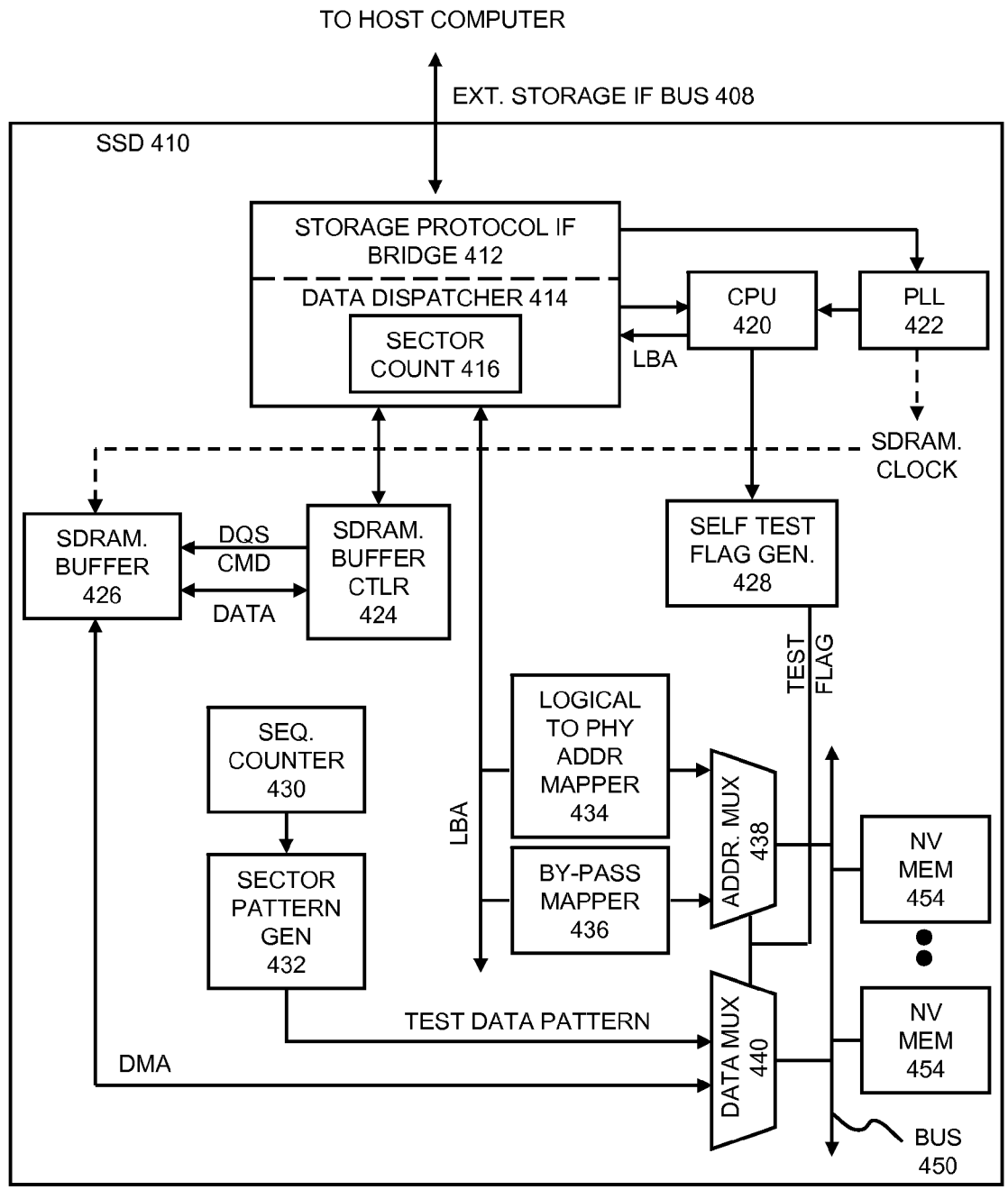
FIG. 4 is a block diagram showing an exemplary SSD.

An exemplary SSD 410 is shown in FIG. 4. The SSD 410 can be accessed and used by coupling to a host computer or computing device via an external storage interface bus 408. The SSD 410 comprises a storage protocol interface bridge 412, a data dispatcher 414, a central processing unit (CPU) 420, a phase locked loop (PLL) 422, a self test generator 428, a synchronous dynamic random access memory (SDRAM)

buffer controller 424, an SDRAM buffer 426, a logical-address to physical-address mapper 434, a bypass mapper 436, a sequence counter 430, a sector data pattern generator 432, an address multiplexer (ADDR MUX) 438, a data multiplexer (DATA MUX) 440 and a non-volatile memory array 454.

The storage protocol interface bridge 412 is configured for transmitting data between the host computer (not shown) and the SSD 410 via a common protocol (e.g., Universal Serial Bus (USB), Serial Advance Technology Attachment (SATA), etc.). Data dispatcher 414 further includes a sector count register 416. Data dispatcher 414 is configured to conduct data transaction to and from the non-volatile memory array 454 by either sending or retrieving data from a starting address (e.g., a sector address) followed by a number of sectors. Sector count 416 is configured to keep tracking the number of sectors in each data transfer transaction. CPU 420 is configured for coordinating overall operations of the SSD 410. PLL 422 is configured for generating clock (e.g., SDRAM clock) signal for the SDRAM buffer 426. The SDRAM buffer 426 is controlled by the SDRAM buffer controller 424 via series of DQS (Data Strobe Signal) in conjunction with the main clock signal generated from PLL 422. The main clock signal is used as a reference for the timing of commands (e.g., read and write operations) including address and control signals. DQS is used as a reference to latch input data into the non-volatile memory array 454 and output data into an external device (e.g., host computer). The self test flag generator 428 is configured for generating a test flag signal to indicate whether a normal operational mode or a test mode to be operated in the SSD 410. In the normal operational mode, the logical-address to physical-address mapper 434 is configured for converting a logical address (e.g., LBA logical block address) into a physical address of the non-volatile memory array 454. In the test mode, the bypass mapper 436 is activated, the logical address is directly associated with a corresponding physical address (i.e., no address conversion or mapping is required). ADDR MUX 438 is connected to both mappers, only one can be used depending on whether the test flag is activated. In a similar fashion, data is accessed via DATA MUX 430. In normal operational mode, data is held in the SDRAM buffer 426 between the non-volatile memory array 454 and the external device (not shown). Access of data between the SDRAM buffer 426 and the non-volatile memory array 454 can be achieved via a direct memory access (DMA) technique. In the test mode, the sequence counter 430 is used for counting each test sequence. Sector data pattern generator 432 is configured for generating various test data patterns. The non-volatile memory array 454 can be single level cell flash memory or multi-level cell flash memory. A data bus 450 is configured to facilitate multiple non-volatile memory chips to the SSD 410.

Figure 5:
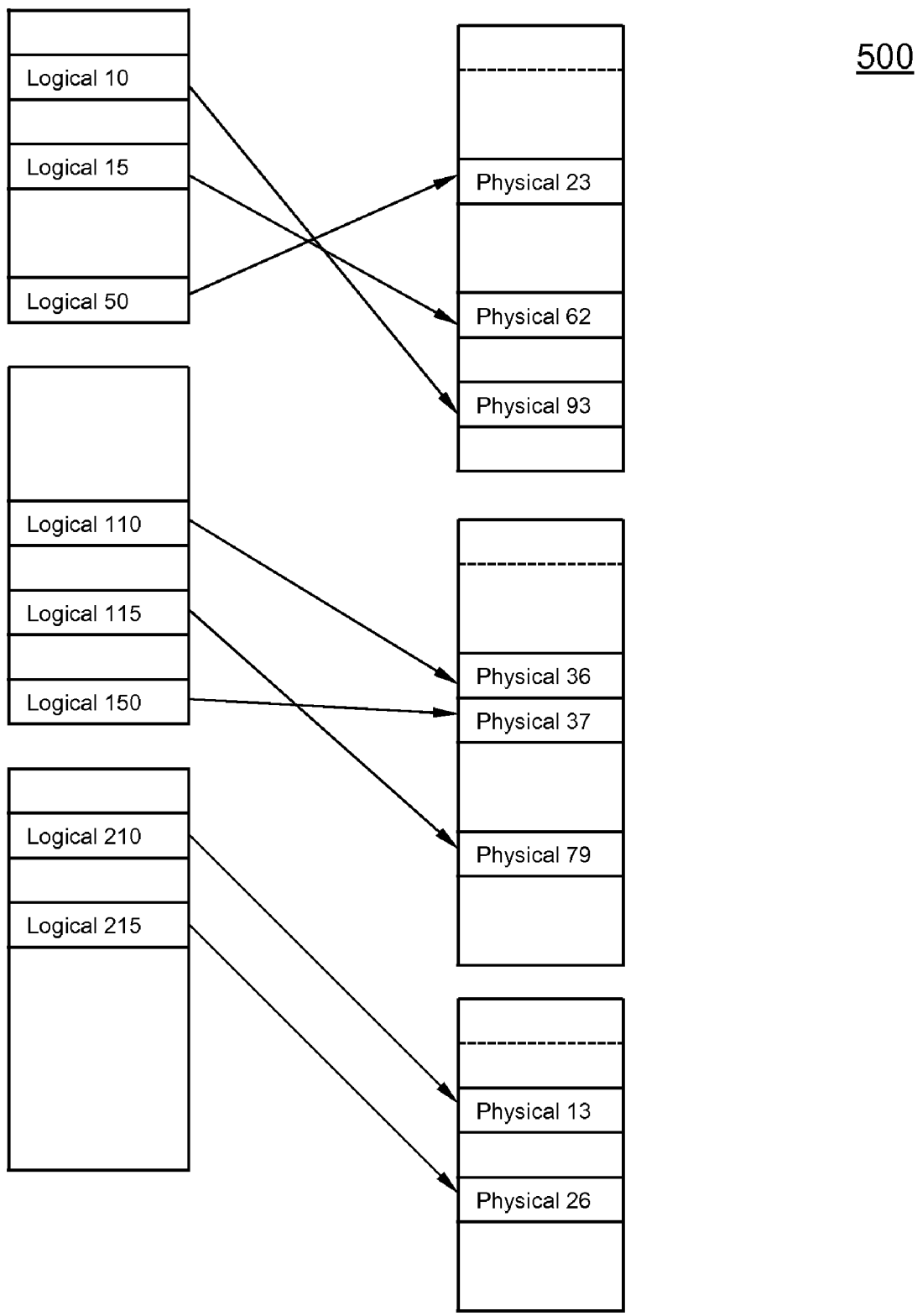
FIG. 5 is a block diagram showing a data structure of logical-to-physical address mapping scheme in a normal operational mode of the SSD of FIG. 4, according one embodiment of the present invention.

The logical address is a memory address used in the host device. The physical address is the address of the non-volatile memory array 454. In the normal operational mode of the SSD 410, a logical-to-physical address mapping scheme is employed to ensure optimal wear leveling of the non-volatile memory array 454. One exemplary normal SSD operational mode mapping scheme 500 is shown in FIG. 5, according to one embodiment of the present invention. In the normal SSD operational mode mapping scheme 500, each logical address is mapped to a physical address of the non-volatile memory array without any specific order. In one example, "logical address 10" is mapped to "physical address 93", "logical 15" to "physical 62" and "logical 50" to "physical 23". In another example, "logical 110" is mapped to "physical 36", "logical 115" to "physical 79" and "logical 150" to "physical 37". One of ordinary skill in the art can see this kind of random mapping makes impossible to pinpoint the location of a failed non-volatile memory chip. As a result, it is not possible to conduct SSD reliability test when the SSD is operated in the normal mode.

Figure 6:
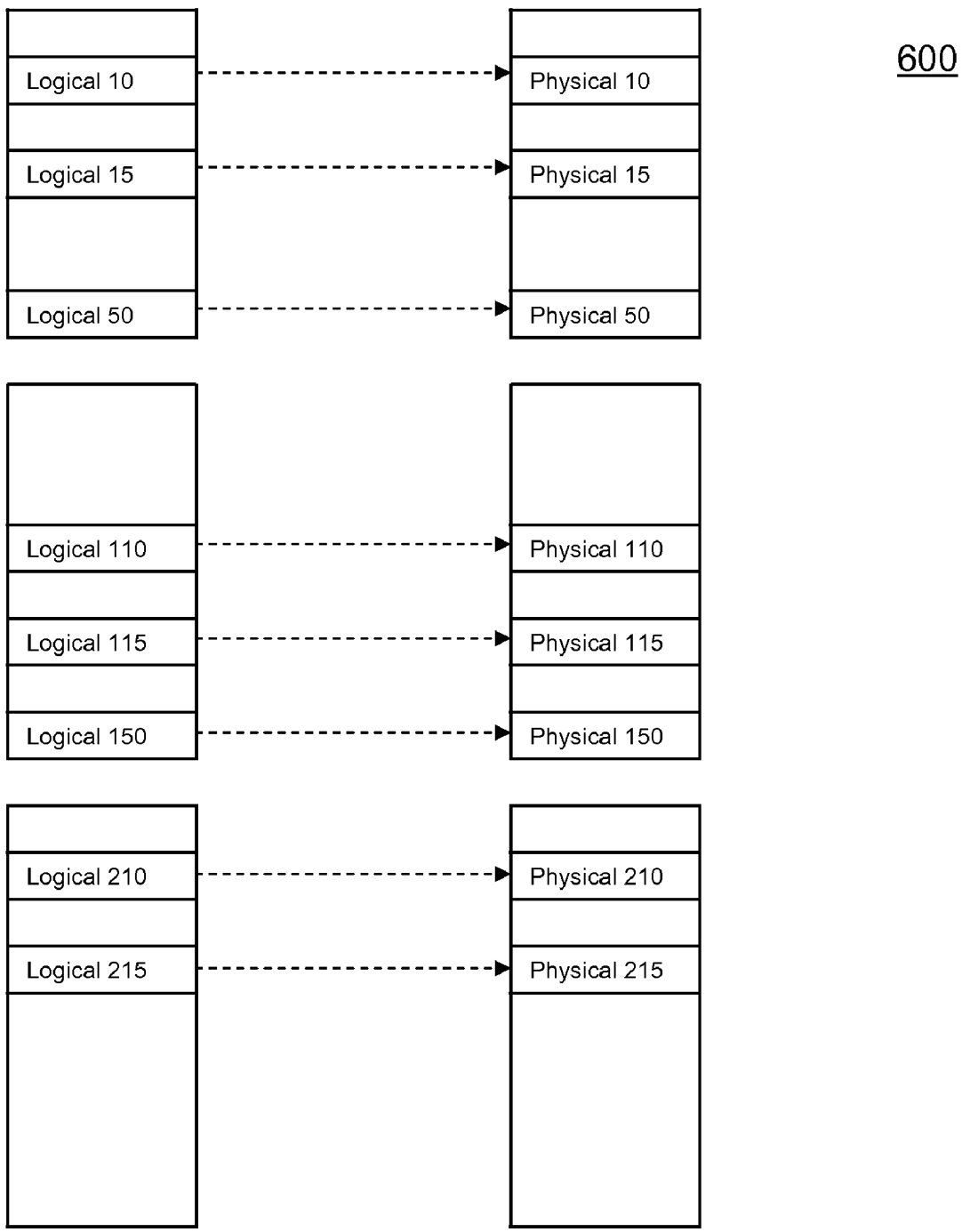
FIG. 6 is a block diagram showing the relationship between logical and physical address in a test mode of the SSD of FIG. 4, according one embodiment of the present invention.

FIG. 6 shows an exemplary address mapping scheme 600 in the test mode of the SSD 410, according to an embodiment of the present invention. In contrast to the normal operational mode, logical address is mapped to physical address in a one-to-one ordered relationship. For example, "logical address 10" is mapped to "physical address 10", "logical 15" to "physical 15", "logical 50 to physical 50", and so forth. To achieve this, the test mode of the SSD 410 can either bypass normal logical-to-physical address mapping scheme or directly map logical to physical addresses.

Figure 7:
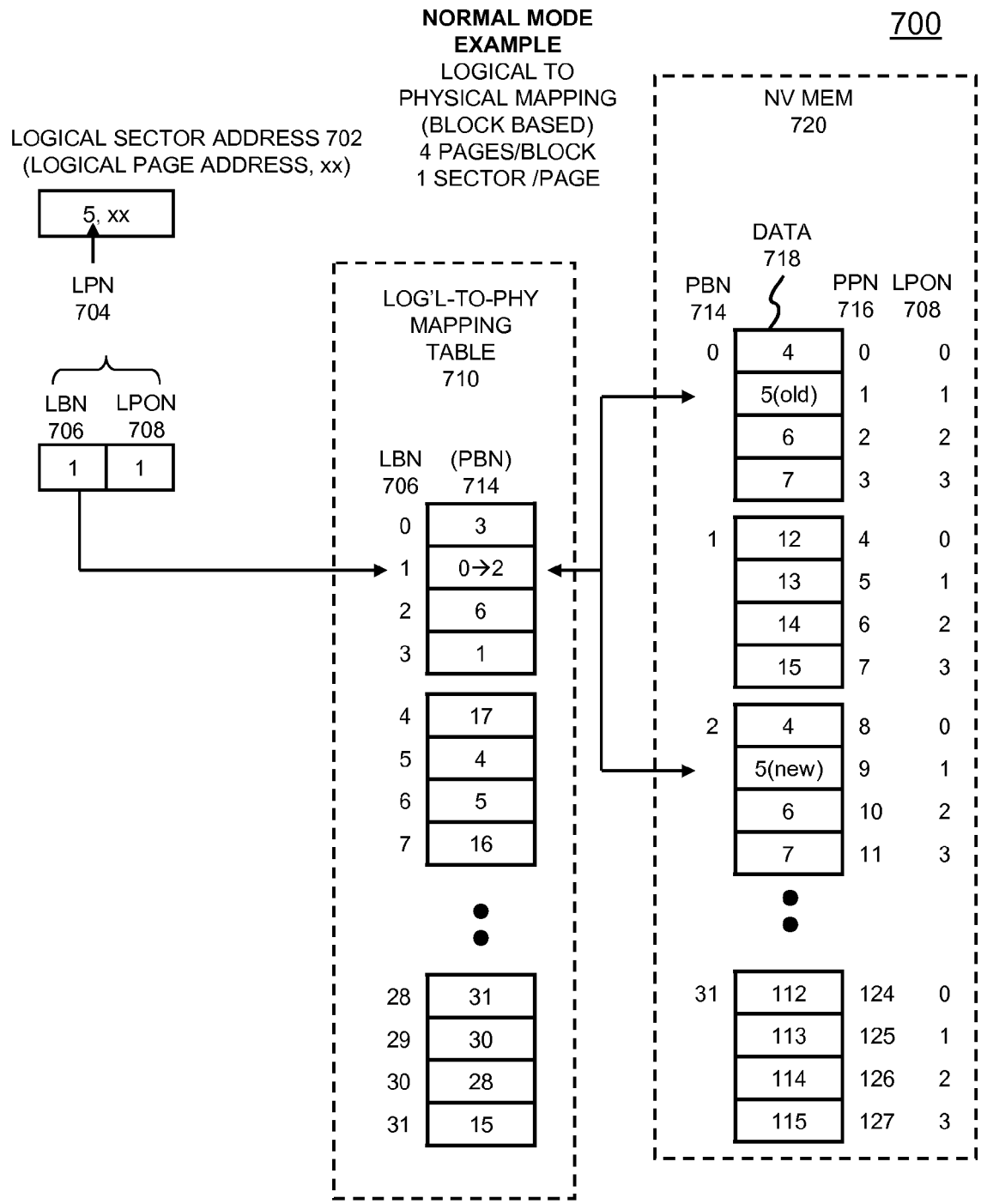
FIG. 7 shows an example of non-volatile memory array accessing scheme in normal operational mode of an SSD.

Referring now to FIG. 7, there is shown an example 700 of a non-volatile memory array accessing scheme in normal operational mode of an SSD (e.g., SSD 410 of FIG. 4). For illustration and description simplicity, a block based SSD having four pages per block and one sector per page is used in the example 700.

A logical sector address 702 is shown as '(5, xx)', which represents a logical page address (LPN) 704 of '5' with sector offset 'xx'. Since there are four pages per block, LPN 704 can be further partitioned into a logical block number (LBN) 706 plus a logical page offset number (LPON) 708. In this case, LBN 706 is '1' resulted from a mathematical calculation of '5 modulo 4', where '5' is LPN 704 and '4' is number of pages per block. LPON 708 is the remainder of the '5 modulo 4', which is equal to '1' in the example 700.

In the normal operational mode, a logical-to-physical address mapping table 710 is used for converting the logical address into physical address of the non-volatile memory array of the SSD. The mapping table 710 correlates LBN 706 to PBN 714 (physical block address). In the example 700, "LBN 1" corresponds to "PBN 0" initially, which is shown to have data 718 with an old value of '5' (i.e. "5(old)") at "PPN 1" of "PBN 0" of the non-volatile memory array 720. The physical addresses PPN (physical page number) 714 and PBN 714 are correlated to logical addresses LPON 708 and LBN 706, respectively.

In the normal mode, when new data is to be written or programmed into physical address in the old block (i.e., "PBN 0") after the initial data has been stored, a new block must be allocated first and then the entire content of old block is written to the new block. In the example 700, it is shown the new block is "PBN 2" as indicated by "0→2". The data is written to the new block (i.e., "PBN 2"), which comprises four physical pages from "PPN 8" to "PPN 11". In the example 700, data '5' (shown as "5(old)") is now written to "PPN 9" of "PBN 2" as "5(new)". In other words, physical addresses "PPN 9" and "PBN 2" are correlated to logical addresses "LPON 1" and "LBN 1". Allocation of a new block is based on a wear leveling algorithm employed in an SSD controller. Different vendor or even different version of a firmware used in the controller can cause different allocation thereby impossible to pin point the physical location of actual data in the normal operational mode.

Figure 8:
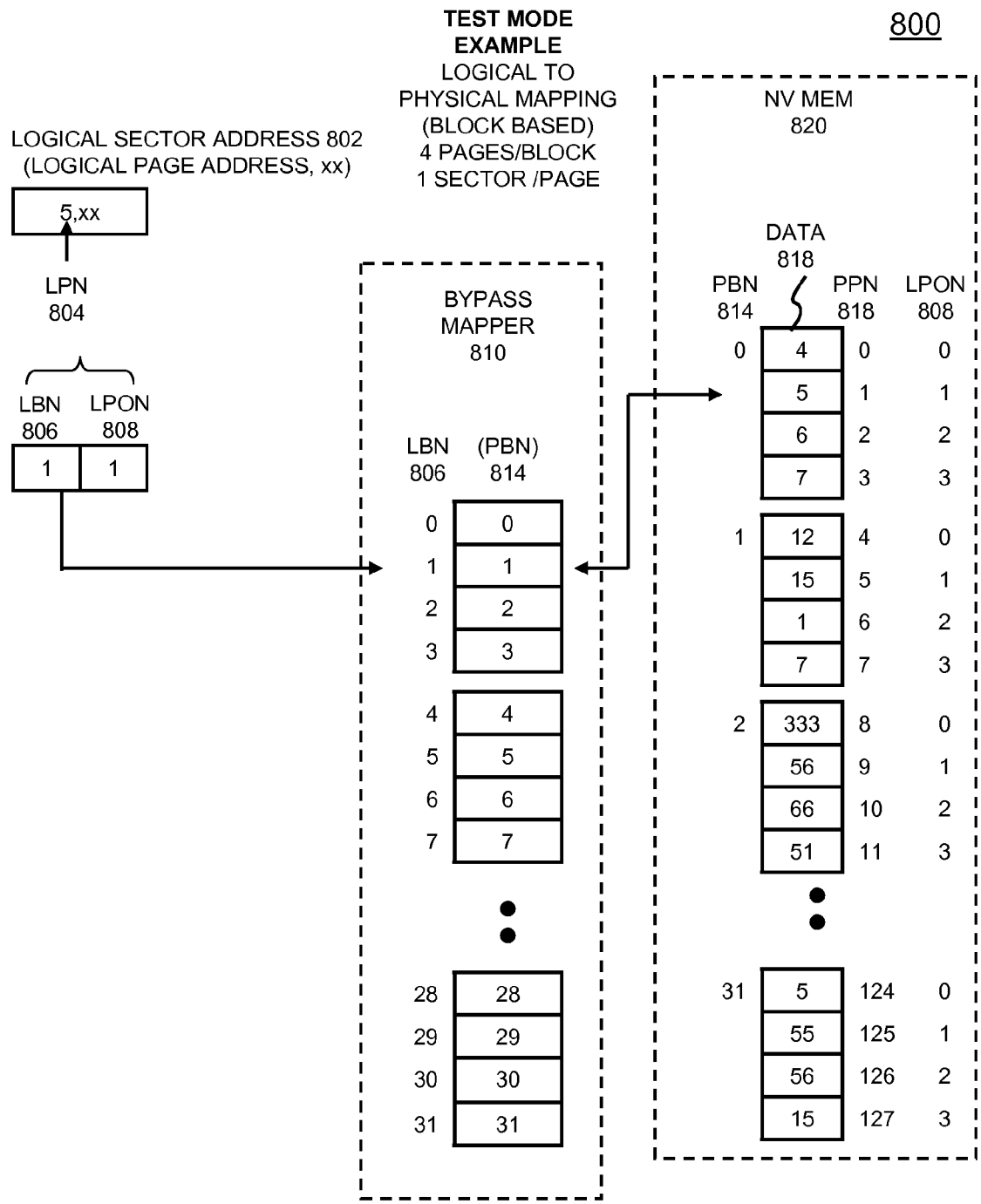
FIG. 8 shows an example of non-volatile memory array accessing scheme in test mode of an SSD.

FIG. 8 shows an example 800 of non-volatile memory array accessing scheme in test mode of an SSD (e.g., SSD 410 of FIG. 4). Similar to the normal mode example 700 of FIG. 7, a block based SSD having four pages per block and one sector per page is used in the example 800.

Logical sector address 802 in form of '(logical page address, xx)' has a value of '(5, xx)'. Logical page address (LPN) 804 of '5' is further partitioned into logical block address (LBN) 806 and logical page offset number (LPON) 808 as '1' and '1'. In the test mode, logical address is directly mapped to physical address shown in a bypass mapper 810. It is evident that LBN 806 has the same value of physical block number (PBN) 814. In another embodiment, the correlation can have a constant offset between LBN 806 and PBN 814.

Accordingly, data 818 stored in the non-volatile memory array 820 is statically located. In other words, no allocation of new block is performed when data programming to the old block. Instead a data erase operation is performed so that the data 818 can be written into the non-volatile memory 820. In the example 800, data content at "LPON 1" of "LBN 1" is always written to "PPN 1" of "PBN 0". PPN 818 is the physical page number of the non-volatile memory array 820. One of ordinary skill in the art knows that a buffer may be required to perform data programming in the test mode, because data is written over the same physical block.

Referring now to FIGS. 9A-9E, there is shown a detailed data programming example 900 of the normal operation mode of a block based SSD. For description and illustration simplicity, the block based SSD comprises four pages per block and eight sectors per page in example 900. This means that each block contains thirty-two (32) sectors. The example 900 starts with a first data write operation at a starting logical block address (LBA) 902 for thirteen (13) sectors. The starting LBA is "sector number 28" in this example.

Figure 9A:
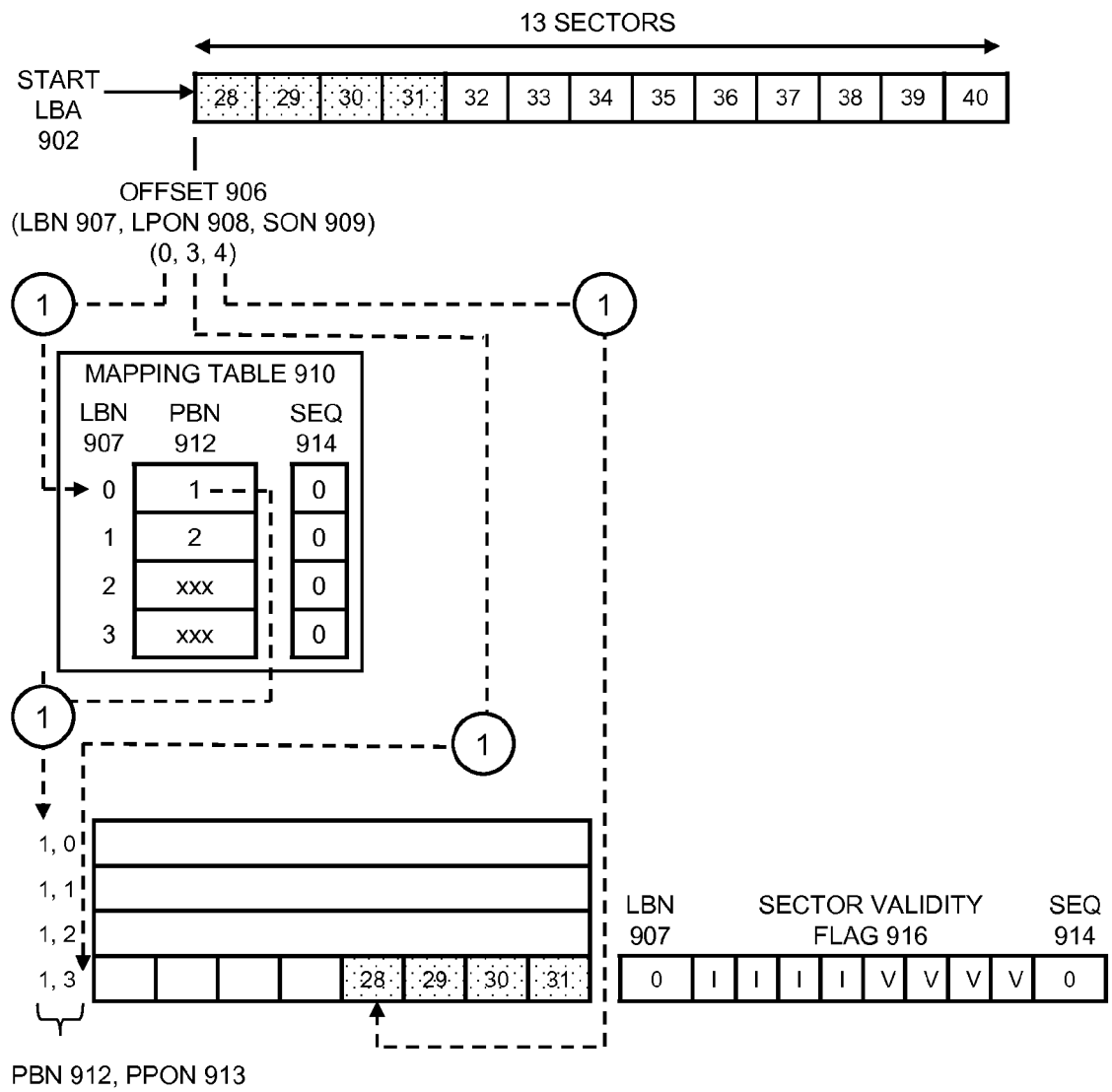
FIGS. 9A-9E are diagrams collectively showing an example of data programming operations in a normal operational mode of an SSD.

FIG. 9A shows the first step of the first data write operation or transaction shown as numerical one in a circle. The first step starts at starting address, which is "sector number 28" or "OFFSET 28". And the first steps ends at the first page boundary encountered, which is '32'. As a result, sectors '28', '29', '30' and '31' are written in the first step.

The offset 906 is partitioned into three numbers representing logical block number (LBN) 907, logical page offset number (LPON) 908 and sector offset number (SON) 909 shown as '(0,3,4)'. In other words, the location of "OFFSET 28" is equivalent to "LBN 0", "LPON 3", and "SON 4".

Next, physical block number (PBN) 912 corresponding to the logical block number (LBN) 907 is determined through a logical-to-physical address mapping table 910. As a result, "LBN 0" corresponds to "PBN 1". Since the data structure of physical non-volatile memory array is the same as that of the logical block address, the data is written to "PBN 1", "PPON 3" (shown as page "1,3") at sector offset '4' (i.e., the fourth sector in page "1,3"). PPON 913 is referred to as physical page offset number, which is the same as LPON 908, while SON 909 is the same for both logical and physical addresses. In the first step, four sectors '28', '29', '30' and '31' are written as indicated by 'V' (i.e., valid data) in respective locations (i.e., last four sectors of page "1,3") of sector validity flag 916. The status 'I' in the sector validity flag 916 represents invalid data. A sequence number (SEQ) 914 is also kept for tracking data writing sequence. In the first step (i.e., numerical one in circle), SEQ 914 is set to '0'.

Figure 9B:
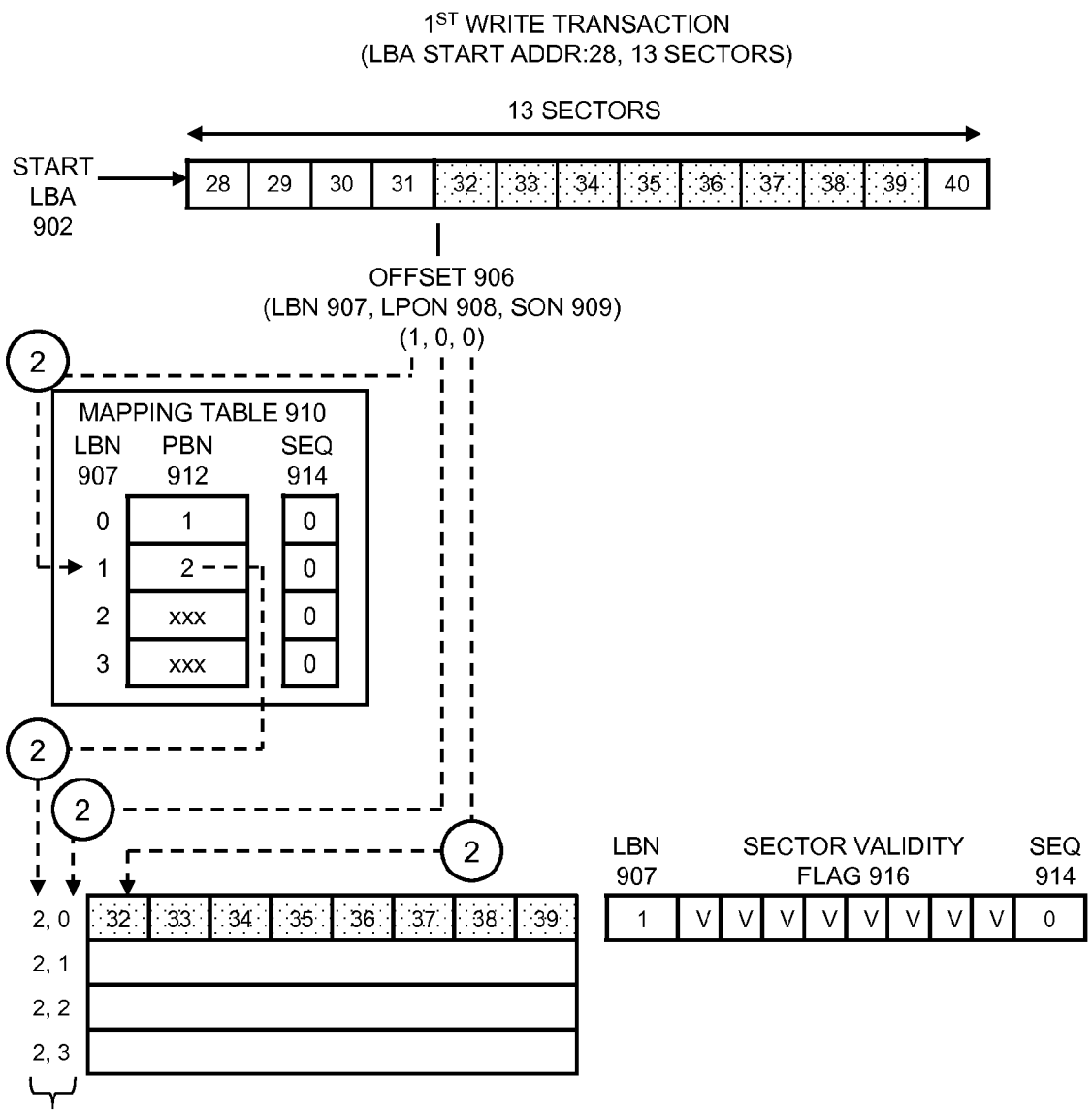

The second step (numerical two in circle) of the first write operation is shown in FIG. 9B. The second step starts at the current page boundary '32' and ends at the next page boundary '40'. The offset 906 for the second step is shown as '(1,0,0)', which means starting at "LBN 1", "LPON 0" and "SON 0". Again the mapping table 910 is used for determining a corresponding physical block. "LBN 1" correlates to "PBN 2" in this example 900. Therefore, an entire page of eight sectors is then written into physical address at "PBN 2", "PPON 0" and "SON 0" of the non-volatile memory array. The sector validity flag 916 for "LBN 1" is set to "V" for all eight entries to reflect the data programming.

Finally, the remaining sector at "OFFSET 40" or "sector number 40" is written to the non-volatile memory as the third step (numerical three in circle) of the first write operation.

Figure 9C:
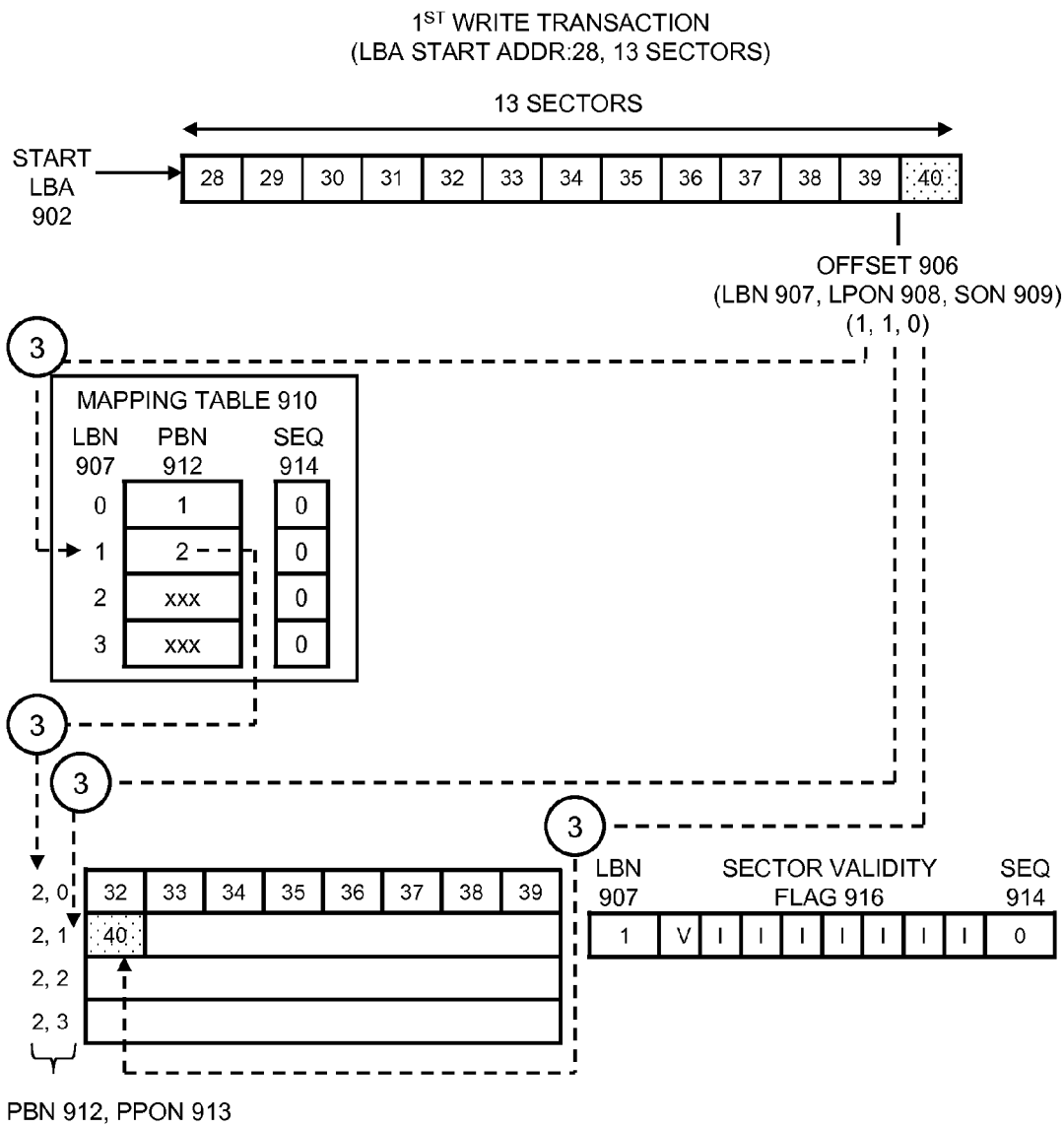

FIG. 9C shows the offset 906 as '(1,1,0)' representing "LBN 1", "LPON 1" and "SON 0". Since "LBN 1" is mapped to "PBN 2" in the mapping table 910, the data is written to the same physical block ("PBN 2") as the second step but at a different page ("PPON 1"). The sector validity flag 916 is shown to have one "V" at first sector.

Figure 9D:
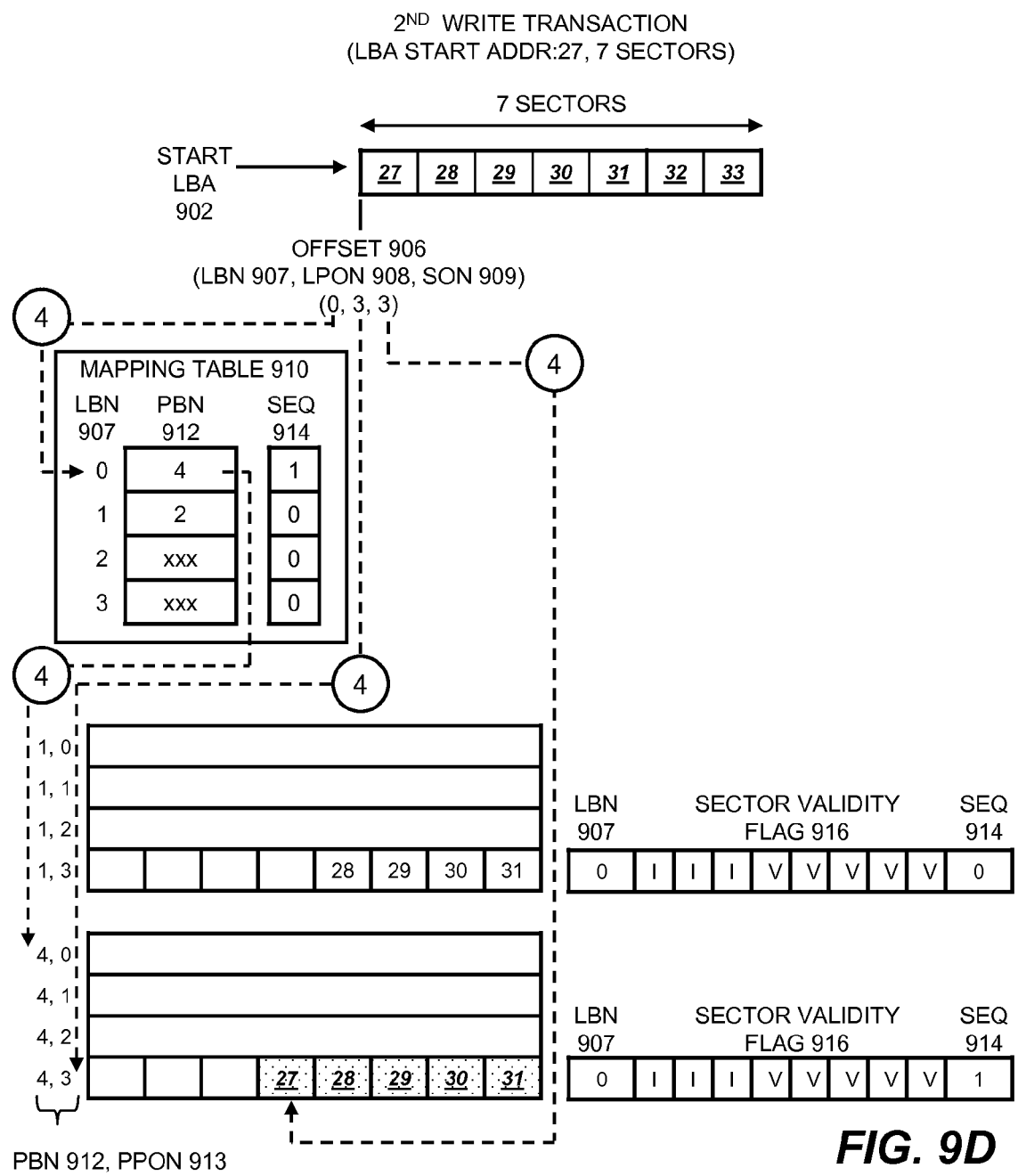
Figure 9E:
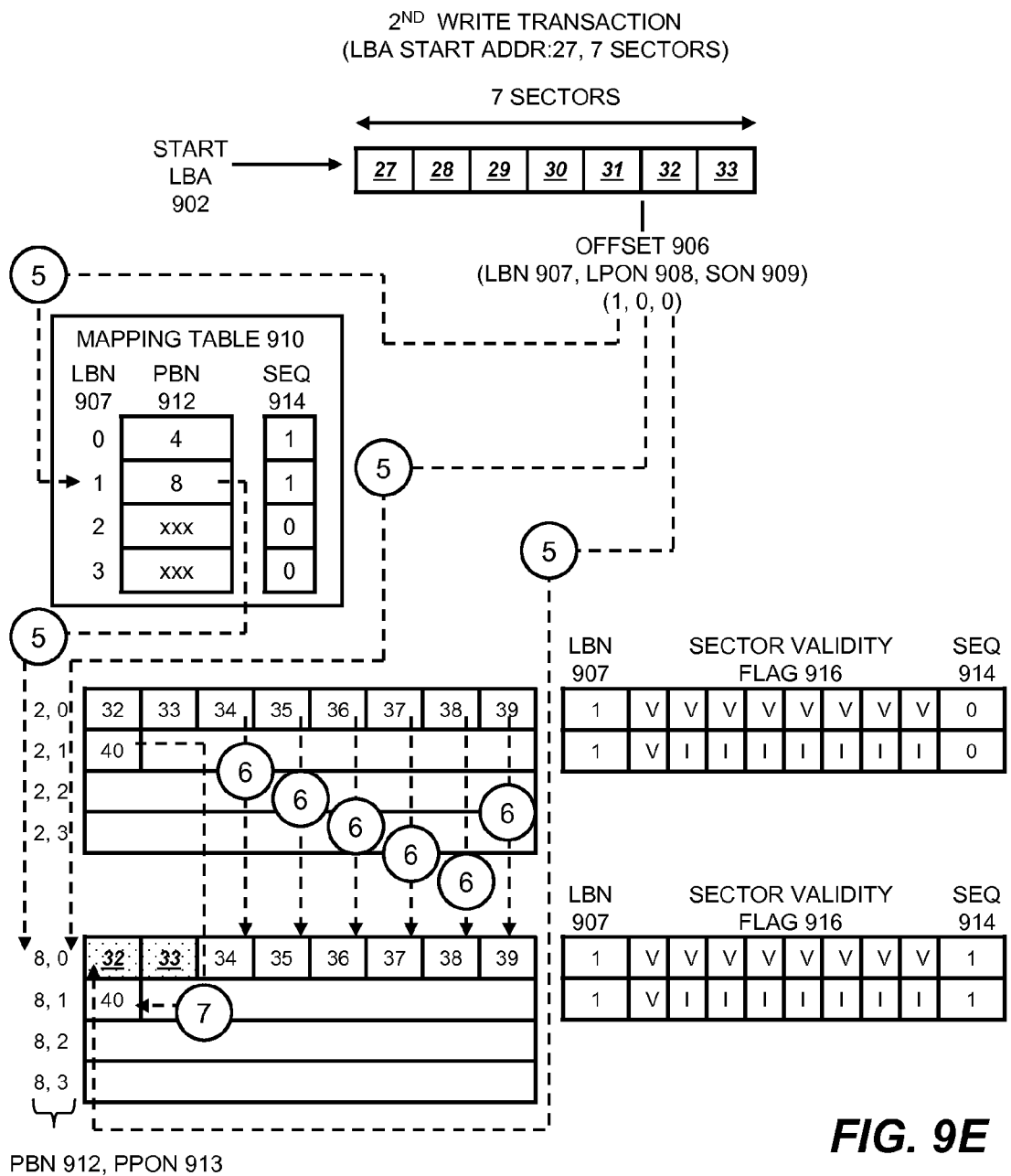

After all thirteen sectors have been written, the first data write operation is completed. FIG. 9D shows a second data write operation starts at "OFFSET 27" for seven (7) sectors. The second data write operation starts at the fourth step (denoted by numerical 4 in a circle), as a continuation of the three steps in the first data write operation. In the beginning of the fourth step, the offset 906 is similar partitioned into LBN 907, LPON 908 and SON 909 as '(0,3,3)'. Again, the mapping table 910 is used for correlating LBN 907 to a corresponding PBN 912. Data range of the second data write operation overlaps that of the first data write operation (i.e., both operations write data in "LBN 0"); therefore, data of "LBN 0" cannot be directly written into the old physical block ("PBN 1") in the second data write operation. A new physical block must be allocated instead for the second data write operation. In this example 900, the new physical block for "LBN 0" is "PBN 4". Accordingly, five sectors of data are written to physical address starting at "PBN 4", "PPON 3" and "SON 3". The sector validity flag 916 is also set to reflect five 'V' (valid) sectors. In addition, the sequence number 914 is incremented to '1', which indicates a new version of "LBN 0". The older version has the sequence number 914 as '0' shown at "PBN 0, which is the sequence number 914 set in the first step of the first data write operation shown in FIG. 9A.

The next step of the second data write operation starts again by partitioning the offset 906. It is shown that LBN 907, LPON 908 and SON 909 have the values of '1', '0', and '0', respectively. Similar to the fourth step, data of "LBN 1" cannot be written to the old physical block "PBN 2" anymore. Physical block "PBN 8" is the newly allocated block in this example 900. It is noted that allocation of a new physical block is based on a specific algorithm deployed in the SSD controller mainly for applying efficient wear leveling scheme for the non-volatile memory array.

Two sectors '32' and '33' of new data are written to the new physical block in the fifth step at physical address "PBN 8", "PPON 0" and "SON 0". Because there are valid data in the corresponding page of the old physical block "PBN 2", the remaining pages (i.e., pages '34' to '39') are copied from "PBN 2" to "PBN 8" as the sixth step. The sector validity flag 916 for the page is set to 'V' (i.e., all eight sectors) and the sequence number 914 is incremented to '1'. Lastly, the seventh step is performed to copy valid data (i.e., sector '40') in next page (i.e., "PPON 1") of "PBN 2" to corresponding page of "PBN 8". Similar, the sector validity flag 916 is updated and sequence number 914 is incremented.

Based on the example 900, one of ordinary skill in the art can easily determine that testing SSD is not possible when the SSD operates in its normal mode. Instead a test mode needs to be used, the test mode bypasses wear leveling scheme so that each logical address is directly associated with a physical address in a one-to-one unaltered relationship. One way to achieve this is to use LBN as PBN, according to one embodiment. In another embodiment, LBN and PBN are associated with a constant offset.

Figure 10A:
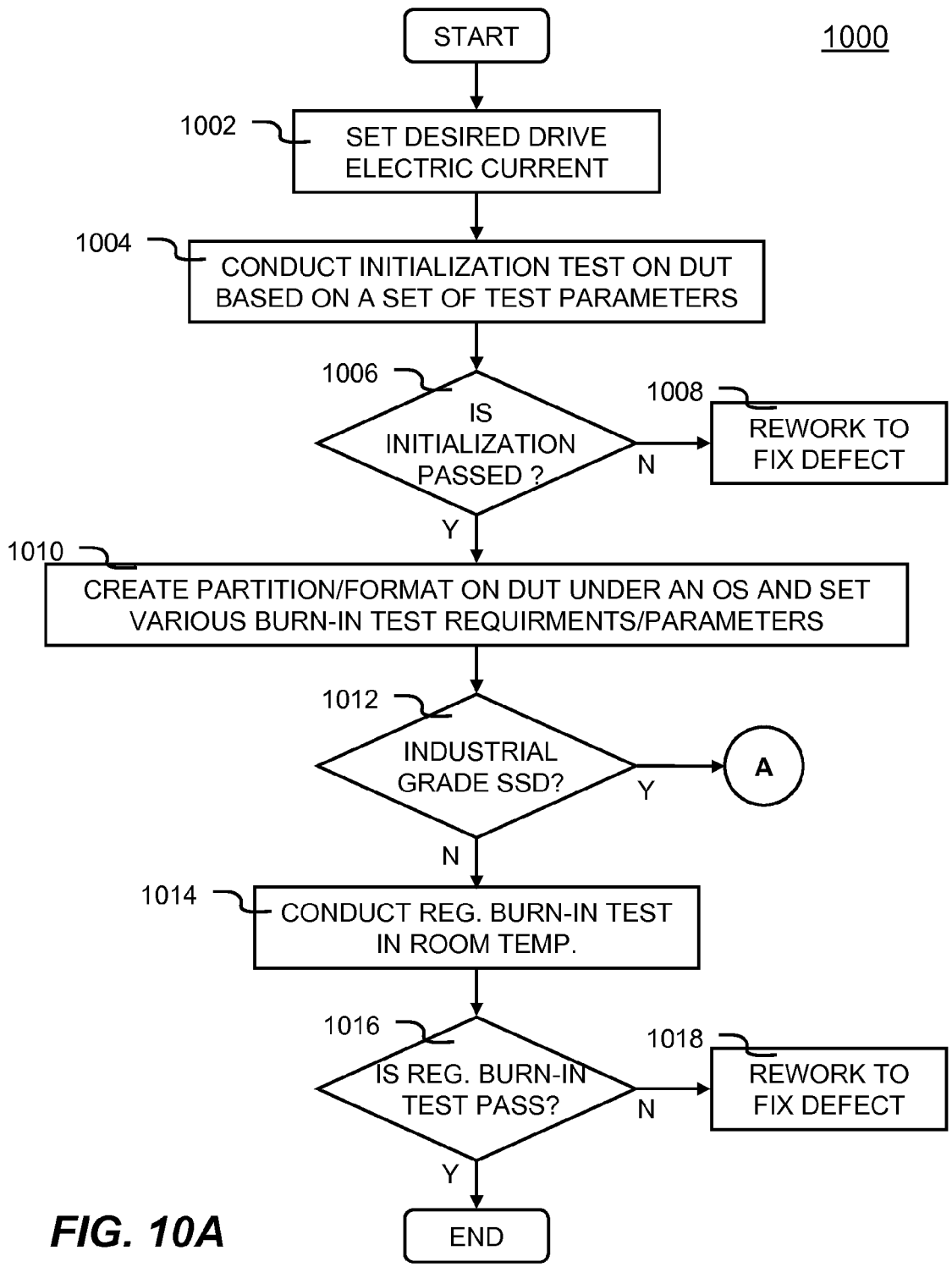
FIGS. 10A-10C is a flowchart showing an exemplary process of an SSD test in accordance with one embodiment of the present invention.
Figure 10B:
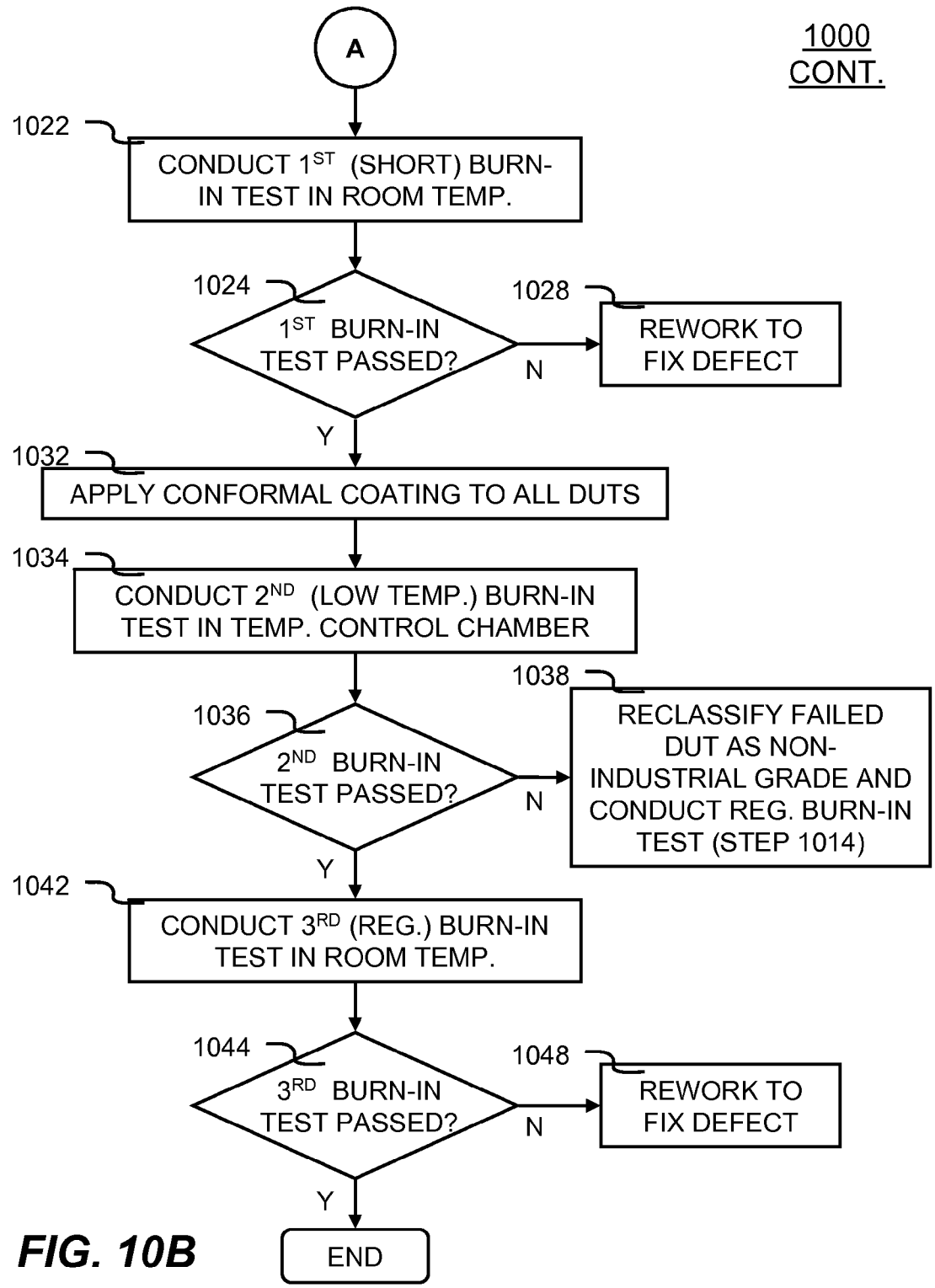
Figure 10C:
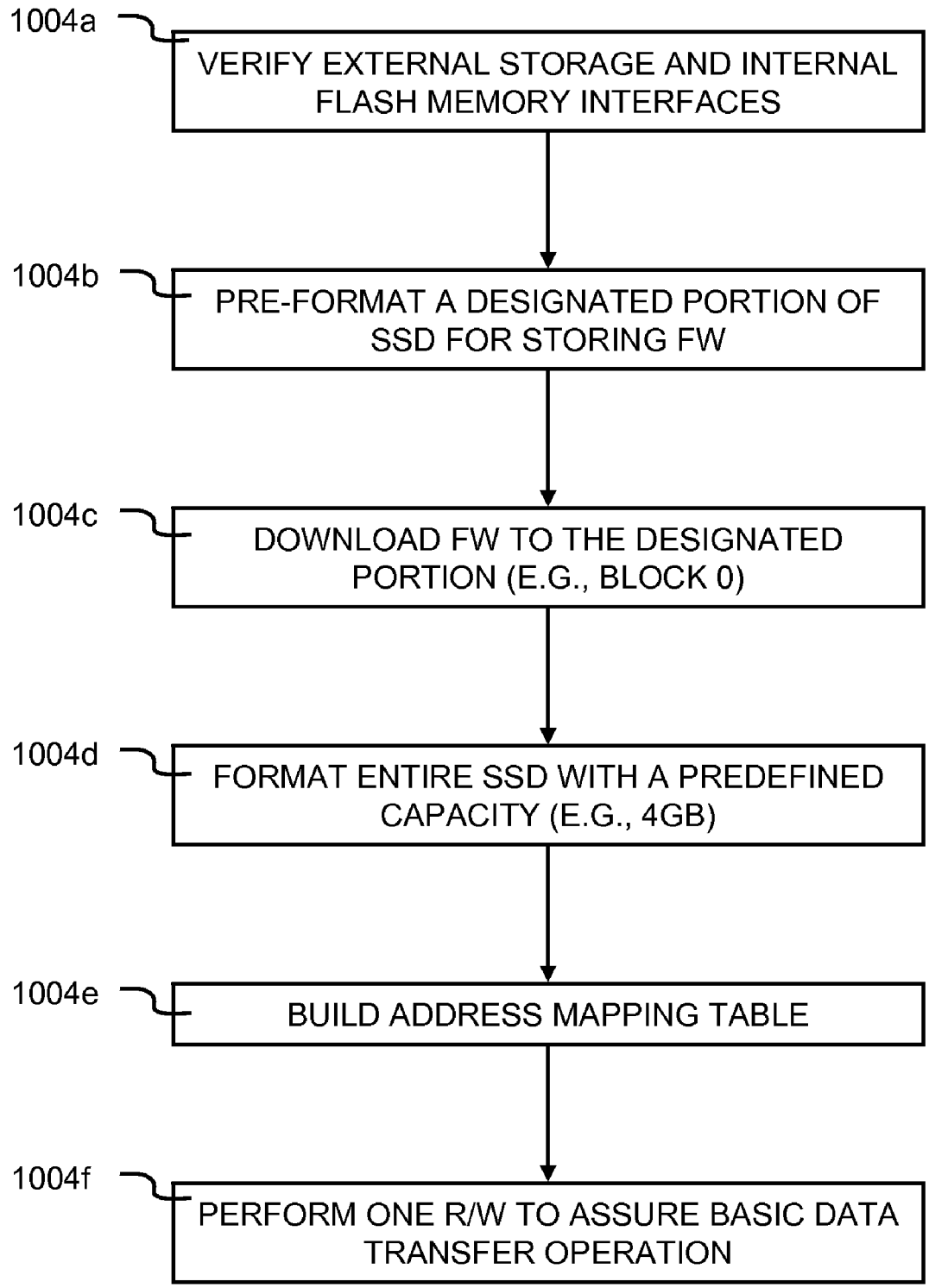
Figure 10D:
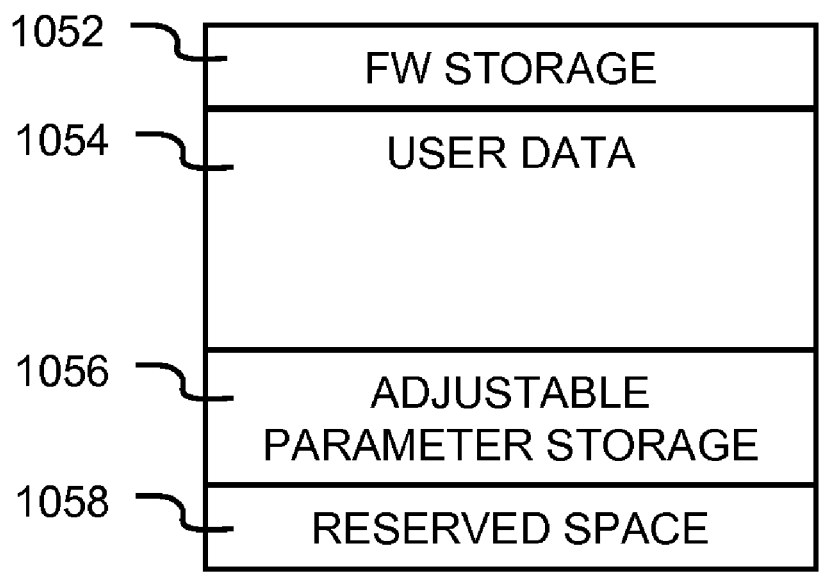
FIG. 10D is a diagram showing an exemplary data structure of a flash memory used in an SSD, according to one embodiment of the present invention.

Referring now to FIGS. 10A-10C, a flowchart of an exemplary process 1000 of conducting SSD test is collectively shown, according to an embodiment of the present invention. Process 1000 starts by setting a driving electric current that is proper for the SSD under test at step 1002. For example, electric current of 6 mA (milli-Ampere) can be used for testing an SSD with a capacity of 64 GB (Giga bytes) formed with eight NAND flash chips. At step 1004, an initialization test is conducted for all SSDs under test (DUT). Detailed steps of the initialization test are shown and described in FIG. 10C below. Next, at decision 1006, it is determined whether each DUT has passed the initialization test. If "no", the failed DUT is sent to a rework unit to fix defects at step 1008. Otherwise, all DUTs that passed the initialization test can be accessed and operated under an operating system (OS). At step 1010, DUT can be further partitioned and/or formatted if desired. A set of test parameters for burn-in test can also be set.

Process 1000 then moves to decision 1012, it is determined whether the DUTs are tested to be qualified as "industrial grade" SSD. If "no" (i.e., regular grade SSD test is desired), a regular burn-in test is performed in room temperature at step 1014. The burn-in test requires writing or programming various known test data patterns to the DUT and read back to compare. Using the comparison criteria set during the initialization stage, process 1000 determines whether each DUT has passed or failed the regular burn-in test at decision 1016. If failed, process 1000 follows the 'N' path to step 1018 for fixing defects in a rework unit. Otherwise, the DUT is declared good as a regular grade SSD and process 1000 ends.

If, however, an "industrial grade" SSD is desired at decision 1012, process 1000 moves to step 1012 to conduct a first burn-in test in room temperature at step 1022. The first burn-in test is a relatively short test to ensure the DUT is a good candidate for further testing as an "industrial grade" SSD. It is noted that the first short burn-in test is shorter than the regular burn-in test performed for qualifying the regular grade SSD.

At decision 1024, it is determined whether the DUT has passed the first burn-in test. If "no", the DUT is sent to the rework unit to fix defects at step 1028. Otherwise, those DUTs passed the first burn-in test are applied with a conformal coating at step 1032. Then, DUTs with conformal coating are put inside a temperature control chamber for a second burn-in test in very low temperature (e.g., −45° C.) at step 1034. In addition, the second burn-in test may be conducted in a vary temperature environment with range between −45° C. and +85° C. At decision 1036, it is determined whether the DUT has passed the second (low-temperature) burn-in test. If "no", the failed DUT are reclassified as non-industrial grade (i.e., regular grade) SSD and sent to step 1014 to conduct regular burn-in test.

For those DUTs passed the second burn-in test, a third (regular burn-in test is performed in room temperature at step 1042. At decision 1044, it is determined whether the DUT has passed the third or regular burn-in test. If "no", the failed DUT is sent to rework unit for fixing defects at step 1048. Otherwise, the DUT is declared as an "industrial grade" SSD and the process 1000 ends. It is noted that either "industrial grade" or "regular grade" SSD must pass a quality assurance test after packaging and all test data must be clean up before shipping to customers. The industrial grade SSD is generally made using at least one Single-Level Cell (SLC) flash memory, while the commercial grade SSD made using Multi-Level Cell (MLC) flash.

SLC flash and MLC flash are two types of NAND type flash memory. The erase block size of SLC flash may be 128K+4K bytes while the erase block size of MLC flash may be 256K+8K bytes. Additionally, NAND type flash memory has a finite number of erase cycles between 10,000 to 1,000,000, after which the flash memory wears out and becomes unreliable.

Comparing MLC flash with SLC flash, MLC flash memory has advantages and disadvantages in consumer applications. In the cell technology, SLC flash stores a single bit of data per cell, whereas MLC flash stores two or more bits of data per cell. MLC flash can have twice or more the density of SLC flash within the same package size. But the performance, reliability and durability may decrease for MLC flash.

Detailed steps of the initialization test 1004 are shown as a flowchart in FIG. 10C. The detailed initialization process may be understood in conjunction with FIGS. 10D and 10E. The initialization test 1004 starts by verifying external storage interface (e.g., Serial Advanced Technology Attachment (SATA)) and internal flash interface (e.g., interface between SSD controller and flash memory) at step 1004a. Next, at 1004b, initialization test performs a pre-formatting of a designated portion of the DUT for storing firmware (e.g., "block 0" of the flash memory, or additional blocks such that designated portion is sufficient to store firmware). Pre-formatting may also includes a scan of all blocks in the DUT to count defective or bad blocks. The pre-formatted area (e.g., "block 0") is shown as FW storage 1052 in a diagram illustrating an exemplary SSD storage structure 1050 in FIG. 10D. Also shown in the SSD storage structure are a user data area 1054, an area for storing adjustable parameters (e.g., wear leveling counter, address mapping table, etc.) and a reserved space 1058 as spare blocks for swapping out bad blocks. After pre-formatting has been completed, firmware (FW) is downloaded at step 1004c. Once FW is downloaded, the controller can operate to format the SSD under test with a predefined capacity (e.g., 4 gigabytes (GB)) at step 1004d. The formatting is performed under OS to create critical files such as master boot record (MBR), root directory, etc. Then, at step 1004e, a logical-to-physical address mapping table is built. Finally, at step 1004f, a basic data transfer (read/write) operation is ensured by reading and writing a small amount of data to the SSD under test.

Figure 10E:
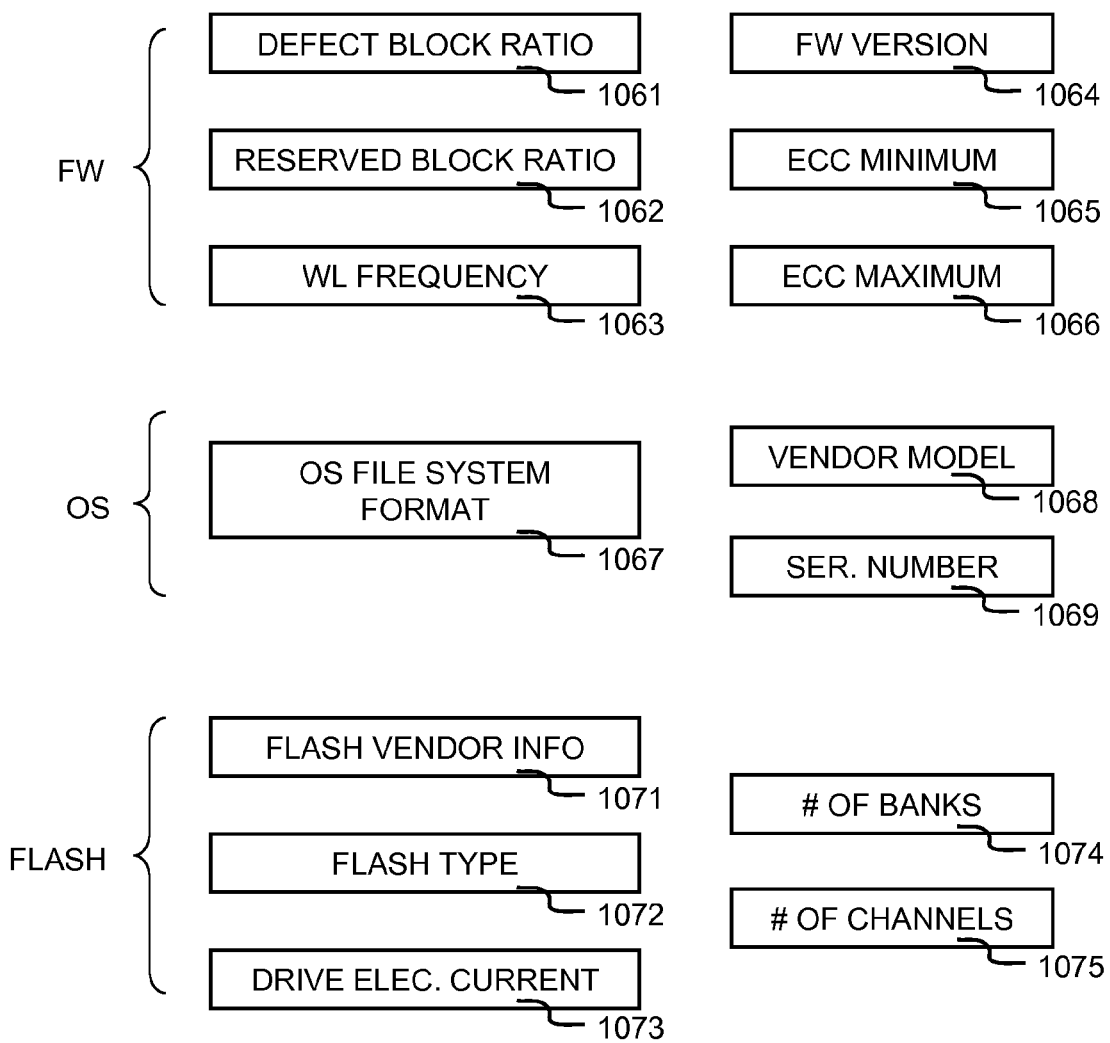
FIG. 10E is a diagram depicting an exemplary set of parameters used in an initialization of an SSD before burn-in tests can be conducted in accordance with one embodiment of the present invention.

A set of test parameters 1060 shown in FIG. 10E are used for controlling various qualities of the SSD. The parameters 1060 include parameters for firmware (FW), operating system (OS) and flash memory chip. The firmware parameters include, but is not limited to, defect block ratio 1061, reserved block ratio 1062, wear leveling (WL) frequency 1063, firmware version 1064, error correction code (ECC) minimum 1065 and ECC maximum 1066. Defect block ratio 1061 is configured to be a low limit in a SSD under test. For example, when the ratio of the number of the defective blocks over the total number of data blocks in the SSD under test is higher than the defect block ratio 1061, the SSD would be declared as a DUT fails to pass a burn-in test. Reserved block ratio 1062 is configured for keeping certain amount of data storage in the reserve space 1058. WL frequency 1063 is configured for readjusting flash blocks. For example, when usage of certain data block has reach the specified WL frequency 1063, the SSD controller will embark a wear leveling readjustment of affected data blocks. ECC minimum 1065 and maximum 1066 are two limits or thresholds configured for determining whether a particular data block is good, bad or in-between. When the number of errors (i.e., bits need to be corrected) is lower than the ECC minimum 1065, the data block is deemed to be good. A block is declared bad when the number of errors has exceeded ECC maximum 1066. When the number of errors is between EEC maximum 1066 and ECC minimum 1065, the data block is declared as in-between (i.e., a yellow light). The in-between blocks may require a replacement, however, it may be used later on, while the bad blocks are marked such that no more future usage allowed.

Initialization parameters for the OS include OS file system format 1067, vendor model 1068 and serial number 1069. Examples of the OS file system format 1067 include, but are not limited to, File Allocation Table (FAT), FAT16, FAT32, and NTFS. Initialization parameters for flash memory include vendor information 1071, flash type 1072 (e.g., single-level cell, multi-level cell), electric current for driving the flash memory chip.

Figure 10F:
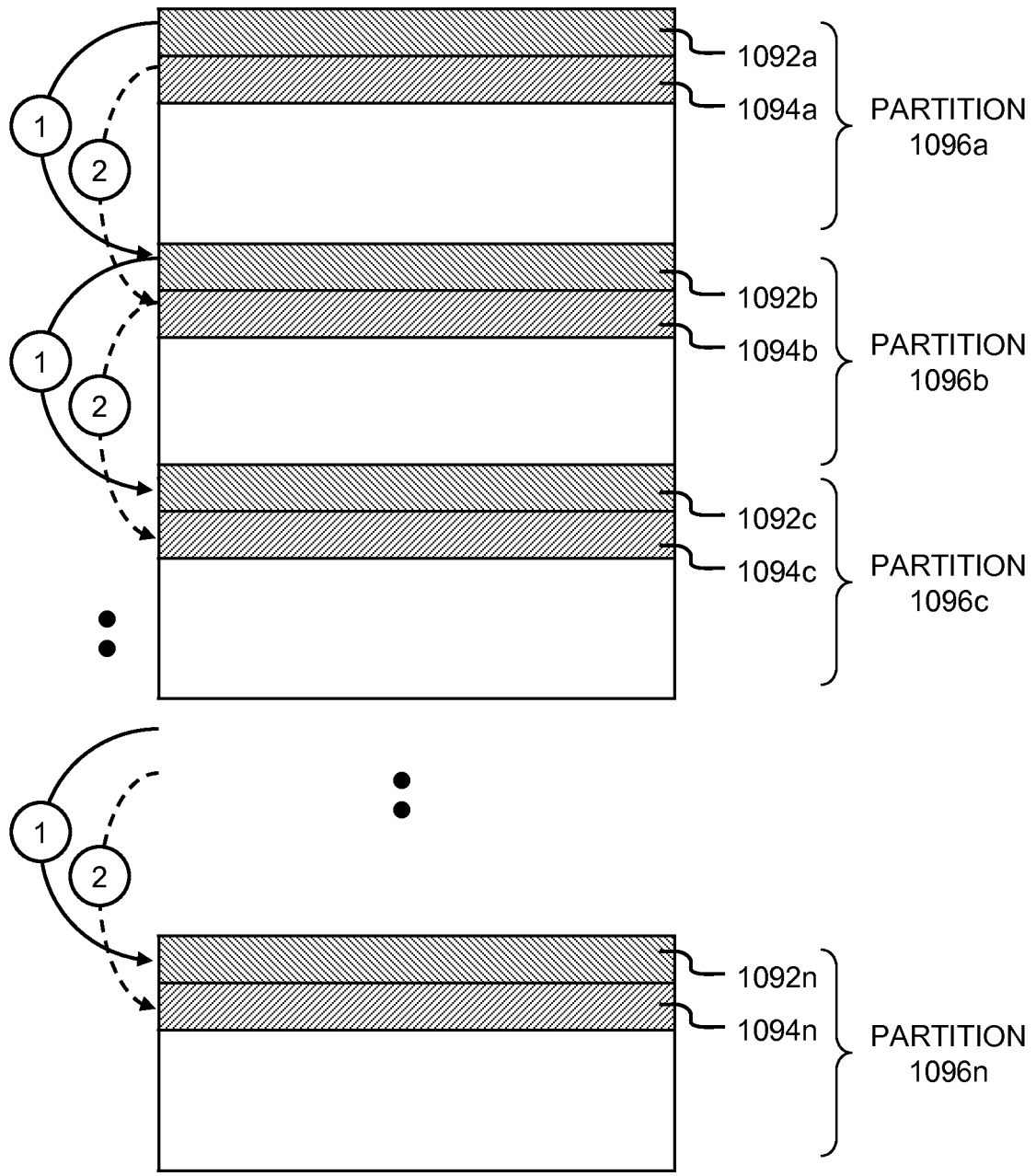
FIG. 10F is a diagram showing an exemplary sequence of data used in an SSD test according to one embodiment of the present invention.

Referring now to FIG. 10F, an exemplary sequence 1090 of data used in an SSD test according to one embodiment of the present invention. During a burn-in test, known data (e.g., fixed data patterns or data content from a "Golden File") are written and read back in the sequence 1090 as indicated by arrowed paths (i.e., path "1" and "2" in circle). The flash memory is partitioned into a number of partitions 1096a-n. Each partition is divided into a number of equal chunks (e.g., 5%, 10%, etc.). The first data path (indicated by "1" in circle) traverses the first chunk 1092a-n of the respective partitions, while the second path traverses the second chunk 1094a-n, and so on. The data paths in the sequence 1090 ensure different portions of the flash memory are tested during an SSD test.

Figure 11A:
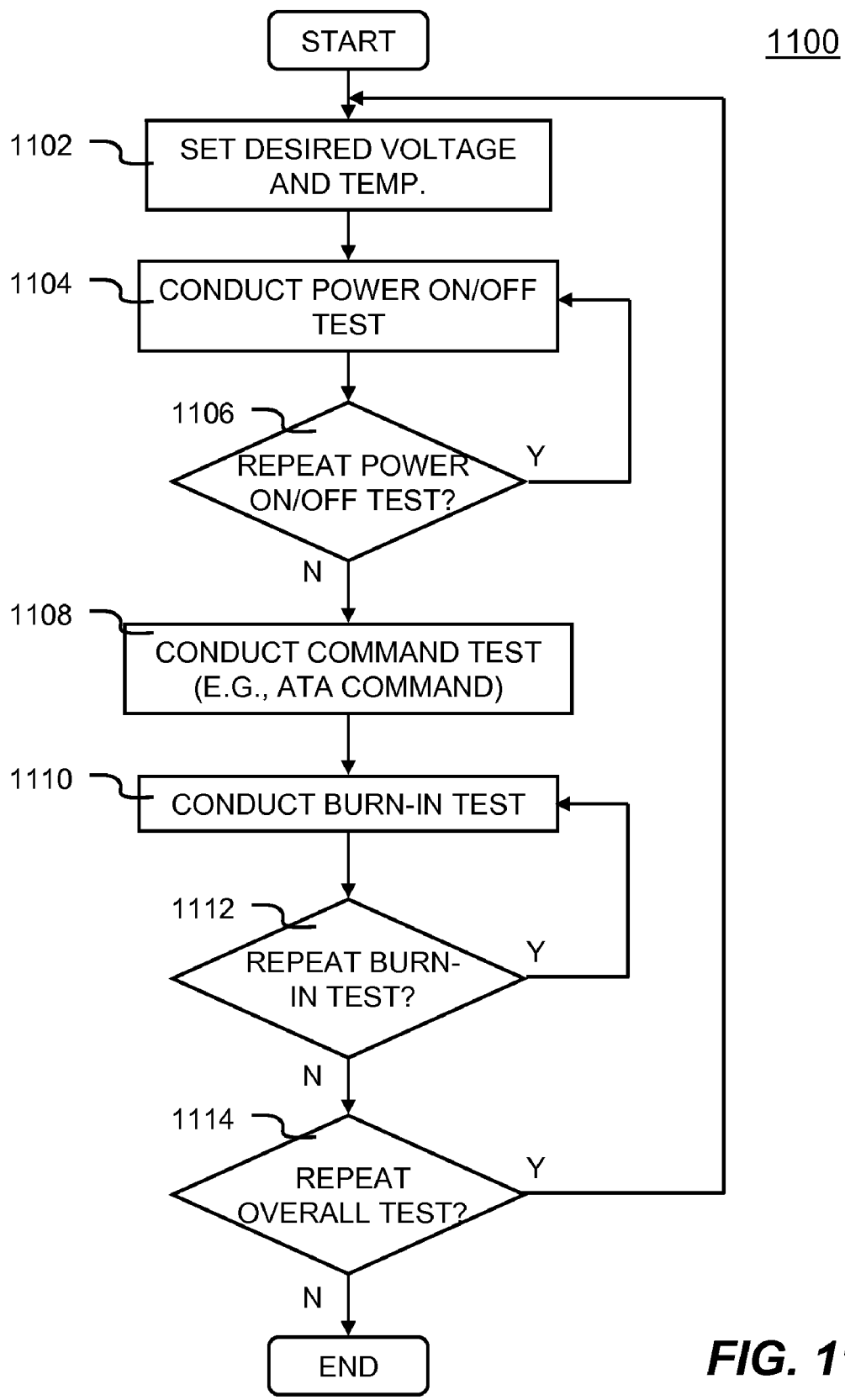
FIG. 11A is a flowchart illustrating an alternative exemplary process of an overall SSD test including power on/off test, according to an embodiment of the present invention.
Figure 11B:
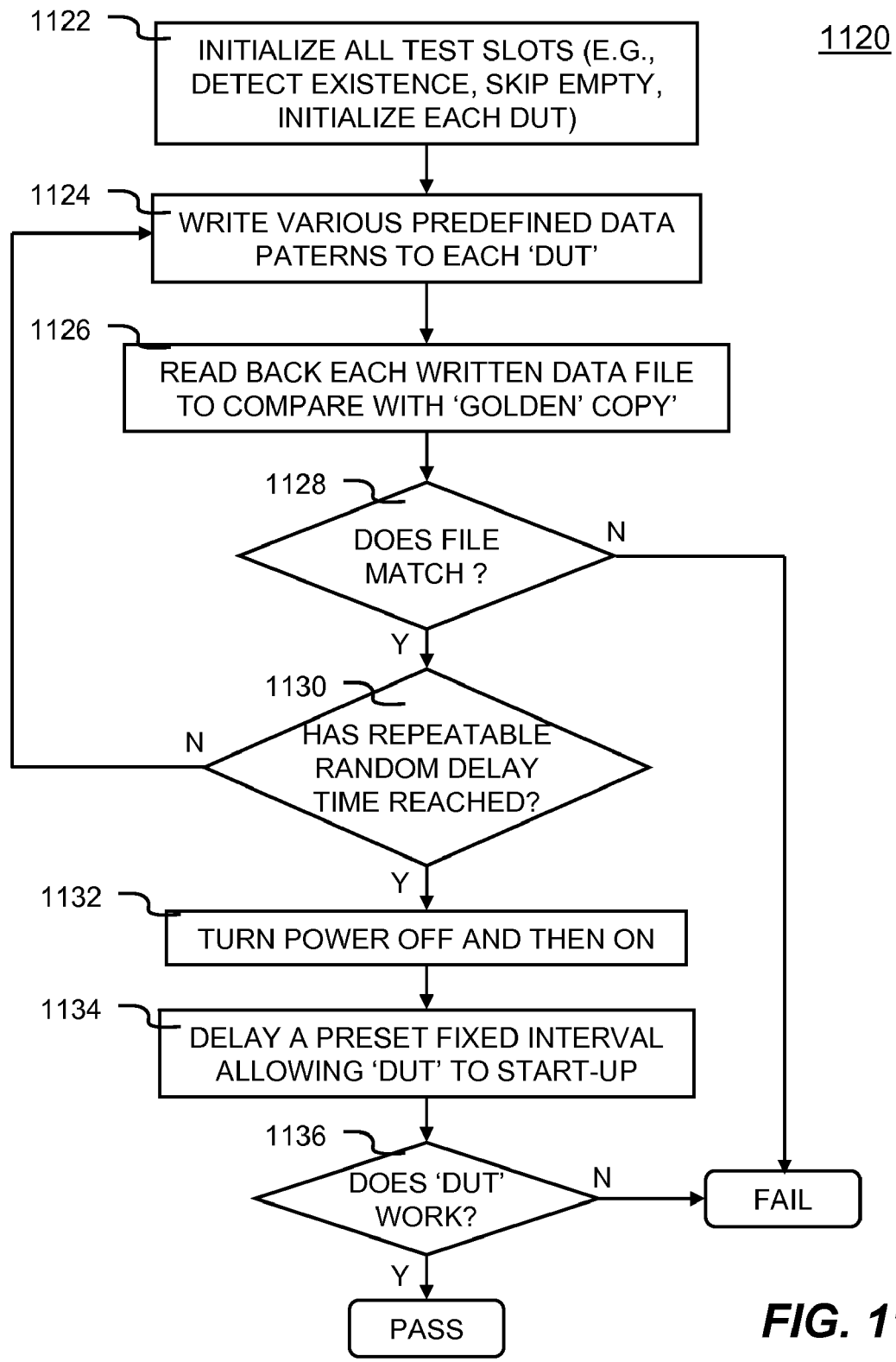
FIG. 11B is a flowchart illustrating an exemplary process of conducting the power on/off test, according to an embodiment of the present invention
Figure 11C:
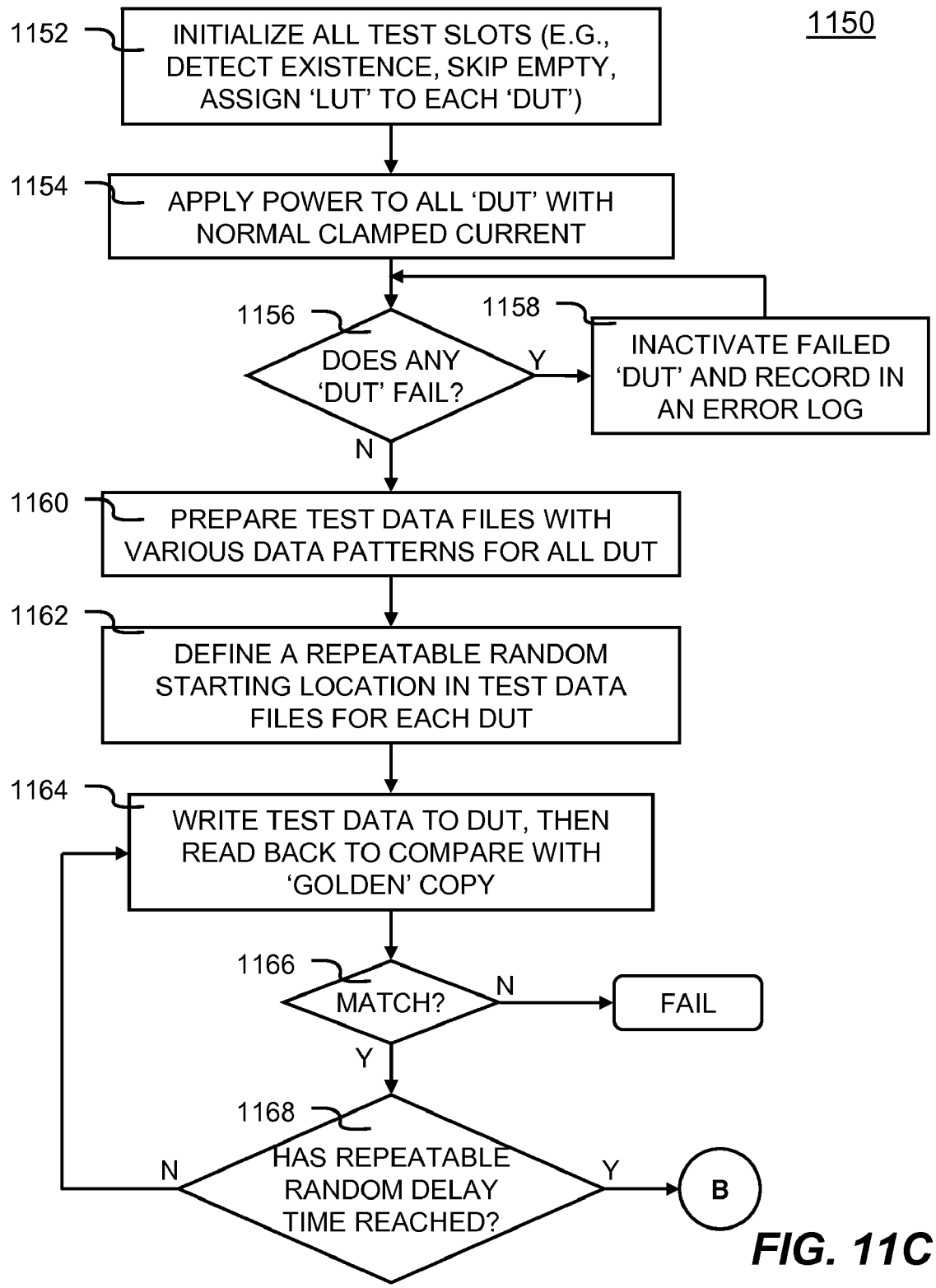
FIGS. 11C and 11D are flowcharts collectively showing another exemplary process of conducting power on/off test, according to another embodiment of the present invention.
Figure 11D:
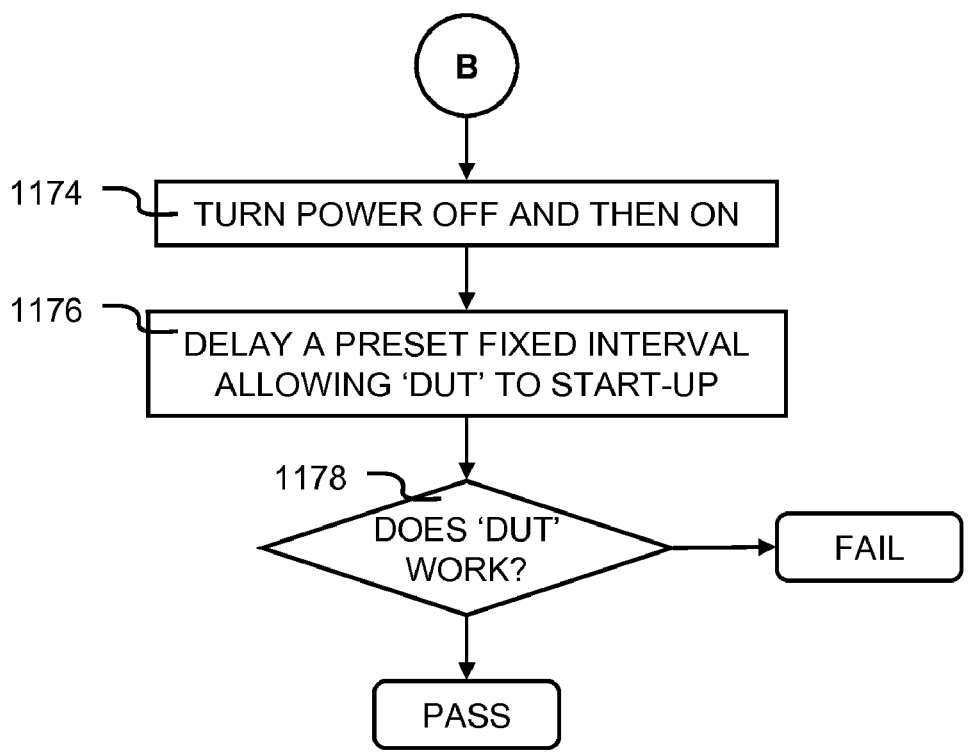

FIG. 11A is a flowchart illustrating an alternative exemplary process 1100 of conducting SSD test including power on/off in accordance with one embodiment of the present invention. Process 1100 starts by setting a combination of desired operating voltage and temperature at step 1102. This can be achieved using voltage control board 114 and temperature control board 116 of FIG. 1A in conjunction with a main SSD test server 102. A temperature control chamber 140 is required for temperature control. Next, at step 1104, power on/off test is conducted. Two detailed flowcharts for power/off test are shown in FIGS. 11B-11D below. Then at decision 1106, it is determined whether power on/off test needs to be repeated again. If 'yes', process 1100 goes back to step 1104. Otherwise, process 1100 moves to step 1108 performing a command test (e.g., ATA commands) to ensure the SSD under test responds properly to the commands. At step 1110, a burn-in test is conducted until it is determined that no more repeated burn-in test is desired at decision 1112. Finally, at decision 1114, it is determined whether the overall SSD test needs to be repeated. If 'yes', process 1100 moves back to step 1102 to repeat the entire test. Otherwise, process 1000 ends.

Referring to FIG. 11B, there is shown a flowchart showing a first exemplary process 1120 of power on/off test according to an embodiment of the present invention. Process 1120 is preferably understood in conjunction with previous figures.

Process 1120 starts by detecting and initializing all SSDs under test (DUT) in all of the test slots (i.e., slot test device 131-138 of FIG. 1A). Each detected SSD is initialized at step 1122. Next, at step 1124, predefined test data are written or programmed to the non-volatile memory array of each DUT. Test data comprises known patterns such as sequential, all 'ones', all 'zeros', alternating 'zeros' and 'ones', or other specific test data stored as a "golden copy". The just written test data are read back at step 1126. Then compared with the known pattern or the "golden copy" at decision 1128. If 'no', the DUT fails in process 1120 because it cannot reliably store data. Otherwise, process 1120 continues to decision 1130, in which it is determined whether a verifiable and reproducible random delay time has been reached. If 'no', process 1120 moves back to step 1124 to repeat the steps and decisions described above. Otherwise process 1120 moves on to step 1132 to perform a power cycle (i.e., cut off and then turn back on the electric power) to the DUT.

The verifiable and reproducible random delay time is configured for each power on/off in process 1120. In one embodiment, the verifiable and reproducible random delay time can be achieved by predefining a power cut off time and initializing a counter in the beginning of process 1120 (e.g., at step 1124). Then the counter is incremented by a known quantity (e.g., time, amount of data written, etc.) until the counter has reached the predefined cut off time. In order to simulate randomness of the real world power outage, each of the predefined power cycle times may be different or random. However, in testing SSD, the randomness needs to be kept in a verifiable and reproducible manner (e.g., using a pseudo random number generator, a reproducible random sequence, etc.).

Next, after the power has been turned back on, a preset time delay is given to allow DUT to initialize or start up at step 1134. The DUT is then checked at decision 1136 to determine whether it remains in a proper operation condition. For example, completely written data files should still exist and file allocation table (FAT) should be intact. If 'no', the DUT fails. Otherwise the DUT passes the current test of process 1120. One of ordinary skill in the art knows that process 1120 can be repeated as many times as needed to ensure a certain level of desired reliability. For example, to achieve certain probability of surviving a power failure, the DUT must pass specific times of power on/off tests.

FIGS. 11C-11D collectively show a flowchart of another exemplary process 1050 of conducting power on/off test for testing SSD, according to another embodiment of the present invention. Process 1150 is preferably understood in conjunction with previous figures.

Process 1150 starts by detecting and initializing all SSDs under test (DUT) in all of the test slots. Each detected SSD is initialized at step 1152. At step 1154, normal operating 'clamped' electric current is applied to all DUT. Next, at decision 1056, it is determined whether any of the DUT fails (e.g., fails to start). If 'yes', the failed SSD is inactivated for further testing at step 1158 (e.g., record the failed DUT in an error log). Process 1150 moves to step 1160 after all DUT has been checked in decision 1156. At step 1160, test data files are prepared (e.g., "golden copy"). Then, at step 1162, a verifiable and reproducible random starting location in the test data files for each DUT (e.g., each DUT may be assigned or associated with a different location of the "golden copy"). Next, at step 1164, text data are written to each DUT and read back for comparison. It is noted that each DUT can contain different portion of the test data due to different starting locations. At decision 1166, it is compared whether the just written data and the "golden copy" are matched. If 'no', the comparison fails thereby DUT fails. Otherwise, process 1150 moves to another decision 1168. It is determined whether a verifiable and reproducible random delay time has been reached. If 'no', process 1150 moves back to step 1164 to repeat writing and comparing test data. The verifiable and reproducible random delay time is substantially similar as the one described in process 1120 above.

If 'yes' at decision 1168, process 1150 moves to step 1174, in which a power cycle to DUT is performed. Next, at step 1176, a fixed time interval delay is applied to allow DUT to initialize or start up. Finally, at decision 1178, it is determined whether the DUT still works properly. If 'no', the DUT fails. Otherwise, the DUT passes the power on/off test. Process 1150 may be repeated as many times to achieve particular testing goal.

FIG. 12 is a diagram showing an exemplary user interface 1200 of an SSD test application module in accordance with one embodiment of the present invention. The user interface 1200 is configured for user to interact with a computer device (e.g., main test server 102 of FIG. 1A) in testing SSD. The user interface 1200 may be a textual or graphical display on a monitor coupling to the main test server. The user interface 1200 is configured for one phase of the SSD test (e.g., 'Phase X'). The user interface 1200 provides information of operating voltage and temperature of the SDD under test. These fields can be configured as input and/or output (e.g., fields for user to specify the desired environment or fields to display the test environment). Information for power on/off test and command test are also shown in the user interface 1200. For example, user can specify how many times the power on/off test to be repeated. Various test data patterns are specified or shown, for example, sequential, random, all 'zeros', all 'ones', etc. Finally, the entire phase can be repeated shown in the bottom of the interface 1200.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable medium. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), etc.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas SDRAM has been shown and described to be used in volatile memory buffer, other volatile memories suitable to achieve the same functionality may be used, for example, DDR, DDR2, DDR3, DDR4, Dynamic RAM, Static RAM. Additionally, whereas external storage interface has been described and shown as PCI-E, other equivalent interfaces may be used, for example, Advance Technology Attachment (ATA), Serial ATA (SATA), Small Computer System Interface (SCSI), Universal Serial Bus (USB), ExpressCard, fiber channel Interface, optical connection interface circuit, etc. Further, whereas "industrial grade" and "commercial grade" SSDs have been shown and described, other terms such as high and regular quality grade SSDs may be used for the same meaning. Furthermore, whereas exemplary blocked based SSD has been described and shown with certain limited numbers of pages and sectors in its non-volatile memory array for illustration simplicity, other numbers of blocks, pages and sectors may be used for accomplishing the same, for example, an SSD can comprise eight sectors per page, 128 pages per block, 64 blocks per die and two dies per chip. Finally, the non-volatile device has been shown and described to comprise two or four device, other numbers of NVM may be used, for example, 8, 16, 32 or any higher numbers that can be managed by embodiments of the present invention. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A solid state drive (SSD) testing method comprising:
specifying a set of test parameters of firmware, operating system and flash memory for a plurality of SSDs under test (DUTs) in an SSD test system, the set of test parameters includes a model number, a serial number, a desired defective or bad block ratio and a size of the firmware, wherein the model and serial number are configured onto each of the DUTs;
performing an initialization test of all of the DUTs in the SSD test system based on the specified test parameters to determine a pre-qualified group of the DUTs that passed the initialization test;
conducting at least one level of burn-in test for each SSD under test in the pre-qualified group, wherein the at least one level of burn-in test includes a first level test configured for short verification, a second level test configure for conducting SSD testing in an environment with varying temperatures, and a third level test configured for rigorous testing of data transfer operations; and
assigning a quality grade to said each SSD under test based on which level of the at least one level of burn-in test said each SSD under test has been tested and passed, wherein the quality grade includes a commercial grade SSD made using at least one Multi-Level Cell flash memory.

2. The method of claim 1, wherein the set of test parameters further includes a reserved block ratio, a wear leveling frequency, and a set of error correction code (ECC) thresholds, the reserve block ratio is configured for reserving a set of reserved blocks to be used for future bad block replacement, the wear leveling frequency is configured for defining a wear leveling scan frequency gap used in swapping uneven wear level blocks, and the ECC thresholds are configured for validation of data from a read operation of the flash memory.

3. The method of claim 2, the ECC thresholds include a maximum number and a minimum number of errors determined by an ECC detector.

4. The method of claim 1, wherein the SSD test system comprises a slot test device.

5. The method of claim 1, wherein the SSD test system comprises a main test server coupled with a plurality of slot test devices via a data network.

6. The method of claim 1, wherein the rigorous testing is conducted in room temperature and configured for continuous writing and reading back test data to and from the flash memory.

7. A solid state drive (SSD) testing method comprising:
specifying a set of test parameters of firmware, operating system and flash memory for a plurality of SSDs under test (DUTs) in an SSD test system, the set of test parameters includes a model number, a serial number, a desired defective or bad block ratio and a size of the firmware, wherein the model number and serial number are configured onto each of the DUTs;
performing an initialization test of all of the DUTs in the SSD test system based on the specified test parameters to determine a pre-qualified group of the DUTs that passed the initialization test, wherein said performing the initialization test comprises scanning entire flash memory of each of the DUTs to determine a bad block ratio, DUTs with the bad block ratio lower than the desired defective block ratio are included in the pre-qualified group; and preparing an initial storage area to ensure the initial storage area is suitable for storing the firmware, only those DUTs having the suitable initial storage area are included in the pre-qualified group;
conducting at least one level of burn-in test for each SSD under test in the pre-qualified group, wherein the at least one level of burn-in test includes a first level test configured for short verification, a second level test configure for conducting SSD testing in an environment with varying temperatures, and a third level test configured for rigorous testing of data transfer operations; and
assigning a quality grade to each SSD under test based on which level of the at least one level of burn-in test said each SSD under test been tested and passed, wherein the quality grade includes a commercial grade SSD made using at least one Multi-Level Cell flash memory.

8. The method of claim 7, said performing the initialization test further comprises downloading the firmware from the main test server to the initial storage area of said each of the DUTs, whereby the firmware can be executed by a controller of said each of the DUTs but not be accessed and/or altered in any way by users.

9. The method of claim 8, said performing the initialization test further comprises formatting the flash memory based on an operating system standard defined in the specified test parameters, such that the flash memory can be accessed by a user.

10. A solid state drive (SSD) testing process comprising:
defining a set of test parameters of firmware, operating system and flash memory of a plurality of SSDs under test (DUTs) in an SSD test system;
performing an initialization test of all of the DUTs based on the defined test parameters to determine a first group consisting of the DUTs that passed the initialization test; and
when industrial grade SSD is desired, conducting a first or short burn-in test for the first group to determine a second group consisting of those DUTs passed the first burn-in test in the first group; applying a layer of conforming coating onto each of the second group; conducting a second burn-in test for the second group in a temperature control chamber to determine a final group consisting of the DUTs that passed the second burn-in test; and conducting a third or regular burn-in test for the final group, wherein the industrial grade SSD is made using at least one Single-Level Cell flash memory.

11. The process of claim 10, further comprises conducting a final quality assurance on those DUTs passed the regular burn-in test and cleaning up test data before shipping to customers.

12. The process of claim 11, wherein the set of test parameters includes defect block ratio, reserved block ratio, wear leveling frequency, maximum and minimum numbers of errors determined by error correction code.

13. The process of claim 11 said performing the initialization test further comprises:
verifying external storage device interface and internal flash memory interface;
pre-formatting a designated area of flash memory within said each of the DUTs;
downloading firmware to the pre-formatted area;
formatting the flash memory entirely to a predetermined capacity;
building a logical-to-physical address mapping table; and
assuring basic data transfer operation by performing a writing and reading to and from the flash memory.

14. The process of claim 10, wherein the SSD test system comprises a slot test device.

15. The process of claim 10, wherein the SSD test system comprises a main test server coupled with a plurality of slot test devices via a data network.

16. A system for conducting solid state drive (SSD) test comprising:
a main test server configured for controlling a group of SSDs under test;
a plurality of slot test devices coupled to the main test server via a data network, each of the slot test devices is configured to facilitate a portion of the group of SSDs under test and said each of the slot test devices is capable of: setting each of the SSDs under test to a test mode, generating various patterns of test data and verifying whether the generated test data have been written successfully to said each of the SSDs under test, wherein the test mode allows direct data programming to said each of the SSDs under test; and
an input device and an output device configured for receiving and displaying data or information during the overall SSD test;
whereby a SSD test application module is installed on the main test server such that the test application module is centrally controlled and test results can be collected.

17. The system of claim 16, further comprises a voltage control board, coupling to the main test server, configured for controlling an operating voltage and a temperature control board, coupling to the main test server, configured for controlling an operating temperature range of a temperature chamber that houses the group of SSDs under test.

18. The system of claim 16, said overall SSD test comprises a series of power on/off tests configured to cut off electric power to the SSDs under test in a verifiable and reproducible random manner.

19. The system of claim 18, wherein the verifiable and reproducible random manner is achieved using a pseudo random number generator to create time delays for power cut-off of the at least one power on/off test.

* * * * *